United States Patent [19]

Helfrick

[11] Patent Number: 4,940,950
[45] Date of Patent: Jul. 10, 1990

[54] FREQUENCY SYNTHESIS METHOD AND APPARATUS USING APPROXIMATION TO PROVIDE CLOSELY SPACED DISCRETE FREQUENCIES OVER A WIDE RANGE WITH RAPID ACQUISITION

[75] Inventor: Albert D. Helfrick, Boonton, N.J.

[73] Assignee: Tel-Instrument Electronics Corporation, Carlstadt, N.J.

[21] Appl. No.: 231,458

[22] Filed: Aug. 12, 1988

[51] Int. Cl.⁵ .............................................. H03L 7/00
[52] U.S. Cl. ........................................ 331/2; 331/25; 455/260
[58] Field of Search .................. 331/117, 2, 25, 46; 455/260; 328/14, 61

[56] References Cited

U.S. PATENT DOCUMENTS

| | | |
|---|---|---|
| 3,845,396 | 10/1974 | Rutman . |
| 3,956,703 | 5/1976 | Noordanus et al. . |
| 3,988,696 | 10/1976 | Sharp . |
| 4,011,516 | 3/1977 | Heimbigner et al. . |
| 4,016,495 | 4/1977 | Machanian . |
| 4,199,726 | 4/1980 | Bukosky et al. . |
| 4,305,045 | 12/1981 | Metz et al. . |
| 4,322,692 | 3/1982 | Brewerton et al. . |
| 4,494,079 | 1/1985 | Light, Jr. et al. . |
| 4,573,017 | 2/1986 | Levine . |
| 4,573,023 | 2/1986 | Cok et al. . |
| 4,574,243 | 3/1986 | Levine . |
| 4,590,439 | 5/1986 | Goggin . |
| 4,592,078 | 5/1986 | Yamada . |
| 4,618,997 | 10/1986 | Imazeki et al. . |
| 4,629,999 | 12/1986 | Hatch et al. . |
| 4,633,194 | 12/1986 | Kikuchi et al. . |
| 4,636,733 | 1/1987 | Charbonnier et al. . |
| 4,714,899 | 12/1987 | Kurtzman et al. ............... 331/25 X |

OTHER PUBLICATIONS

Helfrick, A. D., "A Versatile Communications Receiver", Ham Radio, (Jul. 1982).
Helfrick, A. D., "A Modern Synthesizer for Portable Transceivers", QST (American Radio Relay League, Apr. 1982).
Helfrick, A. D., "Universal Synthesizer", QST, (American Radio Relay League, Sep. 1981).
"Advance Information", MC145159-1, MC145157 and MC145158, Motorola, Inc.

Primary Examiner—Robert J. Pascal
Attorney, Agent, or Firm—Nixon & Vanderhye

[57] ABSTRACT

A frequency synthesizer takes advantage of the simplicity of the phase lock loop and the rapid settling time and spectral purity of direct methods of frequency synthesis. "Approximations" and resulting frequency output errors are controlled and optimized to provide high performance, low noise, rapid frequency acquisition and stabilization, wide frequency range, high frequency resolution, and high accuracy and stability. In one embodiment, phase locked loops provide an output frequency with a resolution considerably less than the reference frequencies due to the application of a unique direct synthesis method. Additional resolution (and correction of error due to the approximations) is obtained by slightly varying the frequency of the master reference frequency. As direct frequency synthesis does not suffer from the long lockup times associated with phase locked loops operating at low reference frequencies, such small frequency changes can be made almost instantaneously. Resolutions on the order of hertz or even millihertz can be implemented with extremely rapid PLL lockup time using this technique.

27 Claims, 28 Drawing Sheets

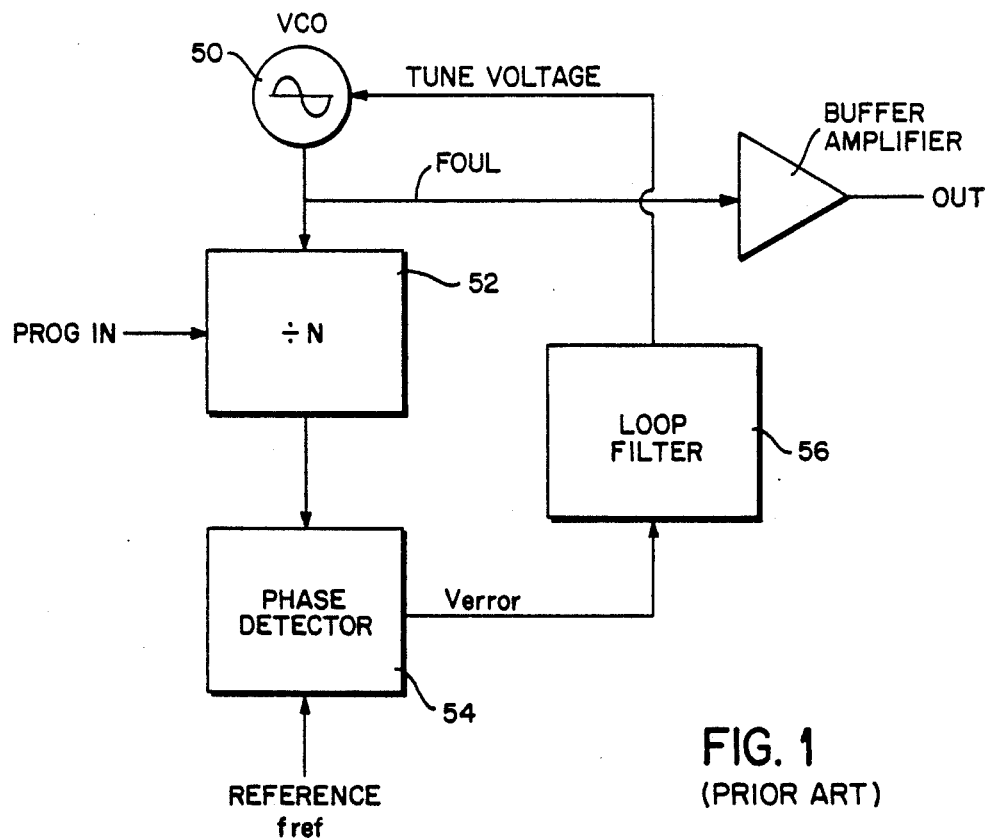
FIG. 1 (PRIOR ART)
FIG. 2 (PRIOR ART)
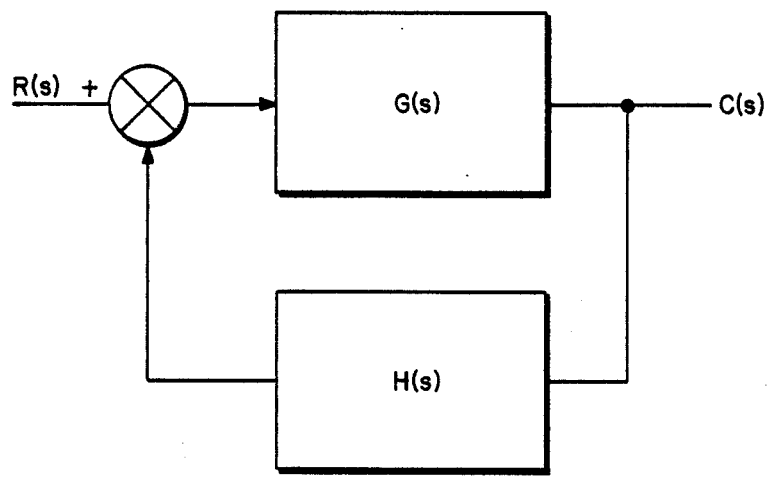

FREQUENCY SYNTHESIS METHOD AND APPARATUS USING APPROXIMATION TO PROVIDE CLOSELY SPACED DISCRETE FREQUENCIES OVER A WIDE RANGE WITH RAPID ACQUISITION

This invention relates to frequency synthesis, and more particularly to producing an AC signal of a selected desired frequency with one or more phase locked loops (PLLs). Still more particularly, the invention relates to controlling the reference input frequency of a PLL so as to control the PLL output frequency.

The single-loop phase locked loop ("PLL") synthesizer is widely used for low cost, low-and-medium performance applications not requiring extremely low phase noise, low reference side bands, or an extremely wide frequency range with narrow frequency resolution. The type of frequency synthesis performed by a PLL is generally known as "indirect" frequency synthesis because the voltage controlled oscillator ("VCO") which generates the output signal of a desired frequency is only indirectly controlled. FIG. 1 is a schematic block diagram of a basic phase locked loop circuit and FIG. 2 is a block diagram of a basic PLL transfer function. The output frequency $f_{out}$ of a VCO 50 is passed through a digital counter 52 which divides the output frequency by an integer value N (the value N may be programmable). A phase detector 54 compares the output frequency from digital counter 52 with a reference frequency $f_{ref}$. An error voltage $V_{error}$ produced by phase detector 54 is filtered by a loop filter 56 and fed back to control VCO 50 in such a polarity that the frequency of the VCO is automatically adjusted to reduce the magnitude of $V_{error}$ produced by phase detector 54. When the phase angle error detected by phase detector 54 is zero, the loop is said to be "locked" and output frequency $f_{out}$ of VCO 50 is given by:

$$f_{out} = N \cdot f_{ref} \quad (1)$$

Counter 52 is typically programmable so that the value N—and thus the output signal frequency $f_{out}$—can be adjusted in discrete steps the spacing between which is equal to the reference frequency $f_{ref}$. Theoretically, any output frequency $f_{out}$ extending from $f_{ref}$ (where N=1) to the highest possible value of N accommodated by counter 52 can be generated. In practice, significant limitations on the performance characteristics of the PLL typically restrict the range.

One disadvantage of the PLL circuit shown in FIG. 1 is that output frequency of VCO 50 does not change instantaneously upon adjustment of divider value N, but instead must be "slewed" from one frequency to another. Theoretically, VCO 50 could slew from its original frequency to a desired new frequency at a sufficiently rapid rate to effect a nearly instantaneous frequency change. However, the characteristics of loop filter 56 (which is needed to prevent reference signal $f_{ref}$ from severely modulating VCO 50 and producing sideband components in the VCO output signal) limits the frequency response of the PLL. The filter 56, which is typically a lowpass filter passing the error signal $V_{error}$ but not the reference frequency $f_{ref}$, dictates several specific characteristics of the loop in addition to rate of output frequency change.

FIG. 3 is a schematic diagram of a typical simple second order active loop filter 56 (one of the more popular phase-locked loop configurations which provides reasonable flexibility and performance). The natural frequency of a PLL incorporating the FIG. 3 loop filter 56 is given as $$W_m = \sqrt{\frac{K_0 K_{VCO} R_2}{N \tau_2 R_1}} \quad (2)$$

where $W_m$ is the natural loop frequency in radians per second, $K_O$ is the constant of phase detector 54 in volts per radian, $K_{VCO}$ is the constant of VCO 50 in radians/-seconds/volts, and $T_2 = R_2 C$ (the time constant of the RC network in the filter feedback loop).

A second loop parameter, called the damping factor, is given by $$\phi = \frac{1}{2}\sqrt{\frac{T_2 K_0 K_{VCO} R_2}{N R_1}} \quad (3)$$

This damping factor determines the characteristics of the PLL during frequency changes.

FIG. 4 shows several examples of PLL acquisition time for different damping factors. The loop acquisition time is a function of the loop filter, the gains of the phase detector and the VCO, and the difference between the frequency at which the loop formerly operated and the new desired loop frequency (i.e., frequency differential). An "over damped" loop (one in which the damping factor is large) achieves the desired frequency in a relatively direct path but consumes more time acquiring that frequency. The "under-damped" loop (in which the damping factor is small) slews rapidly but results in substantial oscillation around the desired frequency. A "critically damped" loop (one where the damping factor is equal to 1) achieves the desired frequency without oscillation in the minimum possible time.

A further loop characteristic called "noise bandwidth" is used to predict the noise characteristics of the PLL. The noise bandwidth is given by $$BW = \frac{K_0 K_{VCO} R_2}{4 N R_1} + \frac{1}{4\tau_2} \quad (4)$$

This bandwidth parameter can be used (with the parameters discussed above) to predict the behavior of the PLL during transient frequency changes and to determine the spectral purity of the generated frequency.

PLL phase noise has a spectrum that theoretically extends from the carrier to + infinity and − infinity. The ability of a PLL to correct for (and thus reduce) phase noise depends upon the gain of the loop at the output frequency of interest. No PLL has gain that extends to infinity, and therefore some noise is always present.

The voltage controlled oscillator is the major source of noise in a phase locked loop (there are other noise sources such as the programmable divider and the phase detector, but the majority of the noise is contributed by the VCO). The amount of phase noise of a VCO is given as an RMS value of frequency jitter:

$$\Delta f_{RMS} = K_{VCO}\sqrt{2KTR_{eq}B_{OSC}} \tag{5}$$

where K is Boltzman's constant, T is the ambient temperature in degrees Kelvin, $R_{eq}$ is the equivalent noise resistance of the voltage-tuned reactance, and $B_{OSC}$ is the bandwidth of the oscillator tuned circuit.

The bandwidth of the voltage controlled oscillator is directly proportional to the oscillator frequency (assuming the same value of circuit quality factor Q)—and the same is true for the equivalent noise resistance. Therefore, phase noise is proportional to both oscillator frequency and the VCO gain constant.

FIG. 5A is a graph of the output spectrum of a typical crystal oscillator, FIG. 5B shows the spectrum of a noisy, free-running voltage controlled oscillator, and FIG. 5C is a graphical illustration of the same VCO output when the VCO is connected in a PLL circuit. Incorporating the VCO into a phase locked loop reduces the phase noise of the VCO and imparts the stability (both long term and short term) of the crystal oscillator to the VCO. Comparing FIGS. 5A, 5B and 5C, the amount of noise produced by the PLL for frequencies close to the carrier (desired) frequency is much less than the amount of noise close to the carrier frequency produced by the free-running VCO, but is still much greater than the noise produced by the crystal oscillator. When the offset frequency from the carrier is increased, the PLL noise begins to approach that of the free-running VCO because of the finite loop bandwidth.

The amount of noise reduction due to the phase locked loop is a function of the reference frequency. A higher reference frequency allows a larger loop bandwidth and hence a greater reduction in VCO phase noise. It is generally a good approximation to assume that the noise of a phase locked loop is inversely proportional to the reference frequency—and the reference frequency determines the frequency spacing resolution of the loop. Thus, there is generally a trade-off between phase noise and loop frequency resolution. That is, a loop with high frequency resolution has decreased phase noise.

Loop response time is also a very significant performance parameter for a PLL. The approximate time required for the PLL to change output frequency by a frequency change $\Delta f$ after change in the value N is given by $$t_a \approx 4(\Delta f)^2/BW^3 \tag{6}$$

(for simplification, Equation (6) is only approximate and is based on a loop with a slightly under-damped characteristic). Bandwidth is inversely related to N (the loop frequency division factor)—so that large N factors decrease the bandwidth and thus increase the phase noise and loop acquisition time.

The simple PLL circuit shown in FIG. 1 does not provide sufficient flexibility for many applications. There are two significant problems associated with the single-loop PLL-based frequency synthesizer. First, the frequency range of the PLL must be limited in order to prevent the PLL from exhibiting various detrimental effects. Second, a further trade-off between rapid loop lockup time and high frequency resolution generally prohibits a single loop synthesizer from providing closely-spaced frequency output steps.

Loop resolution and frequency range can present significant design problems. Large variations in the value N of programmable divider 52 has a significant effect on the loop characteristics due to the fact that the loop gain includes the parameter N (see Equations 2-4). A very narrow PLL resolution requires a very low reference frequency $f_{ref}$ and consequently a low loop 3 dB frequency—which renders the PLL incapable of reducing the phase noise of the oscillator and mechanically-induced "microphonic" disturbances. Low loop nominal frequency is required for high frequency reliability, but a low loop frequency increases the loop lockup time.

A designer must consider all of these characteristics when designing a PLL-based frequency synthesizer for signal generation. Long term stability is important for ultimate accuracy of the frequency output, lockup time is important when frequencies must be changed regularly, and phase noise is always an important consideration in any system.

When the requirements of an application exceed the capabilities of a single phase locked loop, more complex systems with multiple loops are sometimes used. One effective way to avoid some of the performance trade-offs associated with the use of a phase locked loop for wide-range, narrow-resolution frequency synthesis with low phase noise output is to heterodyne the outputs of two PLLs together and take either the sum or the difference frequency resulting from the heterodyning (mixing) process as the synthesizer output. An exemplary double PLL circuit of this type shown in FIG. 6 includes a coarse-tune PLL 58, a fine-tune PLL 60, a mixer 62 and an output filter 64. Coarse-tune loop 58 has a relatively high input reference frequency (100 kHz in the example shown), a wide frequency range (76–100 MHz in the example) and provides coarse frequency steps (spaced 100 kHz apart in the example). The fine-tune loop 60 provides narrow frequency steps (e.g., 1 kHz) and has a frequency range only as wide as the frequency difference between two adjacent frequency steps of coarse-tune loop 58 (100 kHz in the example). Because the tuning range of the fine-tune loop 60 is narrow, the fine-tune loop can use a relatively low reference input frequency (e.g., 1 kHz in the example shown)—thereby preventing excessive phase noise from being generated. By heterodyning two phase locked loop outputs with mixer 62, a relatively broad range of frequencies can be supplied at a desired frequency step resolution without the problems associated with using a single loop circuit for both wide frequency range and high frequency step resolution.

A significant problem not solved by the configuration shown in FIG. 6 is the excessive lockup time required for the fine-tune loop 60. In order to provide a desired resolution of steps between frequencies produced by fine-tune loop 60, the reference input frequency $f_{ref}$ must be equal to or less than the desired synthesizer resolution. One possible solution to this problem is to operate the fine-tune loop 60 at a frequency considerably above the desired range, and divide the output of the loop with a frequency divider (as is shown in FIG. 7). Using this technique, if the factor used to divide the output of the fine-tune loop 60a is Q, the reference frequency for the fine-tune loop may be Q times the desired frequency resolution. However, this arrangement also requires that the output frequency of the voltage controlled oscillator be Q times the desired output frequency of the fine-tune loop—which tends to increase phase noise. Thus, any reduction in phase noise realized by the increase in the reference frequency and the frequency division factor is offset by the increase in the VCO output frequency. There is then, generally, no improvement in the phase noise characteristics of the frequency synthesizer shown in the FIG. 7 arrangement although there is a decrease in lockup time by a factor of approximately Q.

So-called "direct" frequency synthesizers operate somewhat differently from the indirect PLL-based frequency synthesizers discussed above. For direct frequency synthesis, the output frequency is generated directly from the reference frequency (e.g., by dividing or otherwise processing the reference frequency) rather than indirectly (e.g., by a voltage controlled oscillator in "lock" with the reference frequency). For direct frequency synthesis there is no time delay during which one component must "lock" with the reference frequency signal—since all components are driven by the reference frequency signal. Consequently, frequency switching can generally be done very rapidly (and, if desired, synchronously with the reference oscillator) in direct synthesis methods to change the output frequency instantaneously with a minimum transient. In addition, since the output frequency is directly derived from the reference frequency source, the stability of the output (both long term and short term) is as good as the reference frequency source itself.

Various methods of direct frequency synthesis are known. One technique, called "direct numerical frequency synthesis," uses a read only memory 68 (see FIG. 8) to store a desired signal output waveform (e.g., a sine wave). The desired sine wave is divided into N samples and the values of the sine function for those samples are stored in read only memory 68. The read only memory, ROM, in turn, drives a digital-to-analog converter 70 which supplies an analog output $F_{out}$. The ROM 68 is addressed by an address register 72 driven by a reference signal $f_{ref}$ produced by, for example, a crystal controlled oscillator 74. A constant is added by an adder 76 to the contents of address register 72 each time clock oscillator 74 produces a pulse, thereby addressing the next waveform sample stored in ROM 68. Therefore, an output waveform, usually a sinusoid function, is produced from a finite number of samples.

The frequency resolution of the direct numerical frequency synthesis method shown in FIG. 8 is proportional to the reference frequency $f_{ref}$ and inversely proportional to the number of samples stored in ROM 68. Generally, the level of non-harmonic distortion in the output of the arrangement shown in FIG. 8 can be kept relatively small by storing a relatively large number of samples in ROM 68 with a reasonable resolution in generating the output sine function.

One important disadvantage of the direct numerical frequency synthesis technique is that it is limited to frequencies below the VHF region because available logic to operate at high frequencies is very expensive and consumes large amounts of power.

People have used various techniques in the past to increase frequency synthesizer performance. For example, U.S. Pat. No. 3,988,696 to Sharp (1976) discloses a lock detector including a programmable digital frequency divider for the output signal, a reference frequency oscillator, and a phase locked loop which controls the frequency of the synthesizer output. The output of the reference oscillator is first divided by a divider including a counter and associated gate. The divider divides the reference oscillator output frequency $f_r$ by an integer M before applying it to the phase detector of the phase locked loop.

U.S. Pat. No. 3,956,703 to Noordanus et al (1976) teaches dividing a single reference frequency by two different (fixed) divisors to obtain two different reference frequencies. The two reference frequencies are applied to respective programmable phase locked loops. The output of one phase locked loop is injected into the other phase lock loop via a mixer placed within the other loop.

U.S. Pat. No. 4,199,726 to Bukosky et al (1980) and U.S. Pat. No. 4,636,733 to Charbonnier et al (1987) both teach direct frequency synthesizers which obtain desired frequencies after division of a reference frequency by several programmable divider stages.

U.S. Pat. No. 4,494,079 to Light Jr. et al teaches generating a digital word with a microprocessor and converting the word to a voltage with a D/A converter. The output of the D/A converter drives a voltage controlled oscillator. The microprocessor varies the digital word in response to the frequency detected at the output of the VCO.

U.S. Pat. No. 4,011,516 describes a frequency correction arrangement that performs small frequency corrections using all digital techniques.

The following additional references are generally relevant to programmable frequency synthesizers:
U.S. Pat. No. 4,322,692 to Brewerton et al.
U.S. Pat. No. 4,016,495 to Machanian
U.S. Pat. No. 3,845,396 to Rutman
U.S. Pat. No. 4,011,516 to Heimbigner et al.
PCT/JP83/00093 (1983)
U.S. Pat. No. 4,574,243 to Levine
U.S. Pat. No. 4,573,017 to Levine
U.S. Pat. No. 4,305,045 to Metz et al.
U.S. Pat. No. 4,618,997 to Imazeki et al.
U.S. Pat. No. 4,573,023 to Cok et al.
U.S. Pat. No. 4,633,194 to Kikuchi et al.
U.S. Pat. No. 4,629,999 to Hatch et al.
U.S. Pat. No. 4,590,439 to Goggin Additional references which may relevant include the following articles published by the inventor of the subject application:
Helfrick, A. D., "A Versatile Communications Receiver" *Ham Radio*, (July 1982)
Helfrick, A. D., "Universal Synthesizer", *QST*, (American Radio Relay League, Septmeber 1981)
Helfrick, A. D., "A Modern Synthesizer for Portable Transceivers", *QST* (American Radio Relay League, April 1982)

In addition, the inventor's thesis "The Approximation Method Of Frequency Synthesis; Theory, Design and Applications" submitted in December 1987 to the faculty committee of Clayton University in partial fulfillment for the Doctor of Philosophy degree in Applied Science is incorporated herein by reference.

The present invention provides a method and apparatus for synthesizing frequencies which takes advantage of the simplicity of the phase locked loop and the rapid settling time and spectral purity of direct methods of frequency synthesis. The present invention actually introduces "approximations" and resulting frequency output errors into the synthesizer output, but controls and optimizes these errors to provide a high performance, low noise zsynthesizer with rapid frequency acquisition and stabilization, wide frequency range, high frequency resolution, and high accuracy and stability.

In the preferred embodiment, a wide-band phase locked loop produces an output which is heterodyned with the output produced by a narrow-band phase locked loop. The wide-band loop provides wide frequency range steps as well as the majority of the frequency range. The fine-tune loop provides narrow frequency steps which "fill in" the frequencies between the steps of the wide-band loop. The fine-tune loop reference frequency is considerably greater than the output resolution of the synthesizer, thus achieving the desirable situation of a high reference frequency concurrent with a narrow frequency resolution.

Additional resolution and correction of errors introduced by the approximations is obtained by causing the frequency of the fine-tune loop reference input frequency to vary slightly using direct frequency synthesis. Because direct frequency synthesis does not suffer from the long lockup times associated with phase locked loops operating at low reference frequencies, such small frequency changes can be made almost instantaneously—and the fine-tune loop almost immediately "locks" onto the new, shifted reference frequency because the loop frequency is relatively high. Resolutions on the order of hertz or even millihertz can be implemented with extremely rapid fine-tune PLL lockup time using this technique.

The direct frequency synthesizer used to provide the fine-tune PLL reference frequency in the preferred embodiment of the present invention inherently introduces errors between desired (programmed) frequencies and actual output frequencies. These frequency errors are mulitplied by the fine-tune loop to introduce error in the final synthesis output frequency. Accordingly, in accordance with a feature of the present invention, the parameters of the frequency synthesizer are optimized to minimize errors in the final output frequency. In one preferred embodiment, a microprocessor controls and optimizes the direct and indirect frequency synthesizer division ratios. The microprocessor calculates the expected output frequency error based upon the actual mathematical derivation and provides correction of the output frequency.

The present invention thus provides high frequency resolution and accurate output frequencies with rapid lockup time and low phase noise—thus avoiding many of the problems associated with past frequency synthesizers.

These and other features and advantages of the present invention will be better and more completely understood by referring to the following detailed description of presently preferred exemplary embodiments in conjunction with the appended sheets of drawings, of which:

FIGS. 1-3 are schematic block diagrams of prior art phase locked loop circuits;

DETAILED DESCRIPTION OF THE PRESENTLY PREFERRED EXEMPLARY EMBODIMENTS

Figure 3:
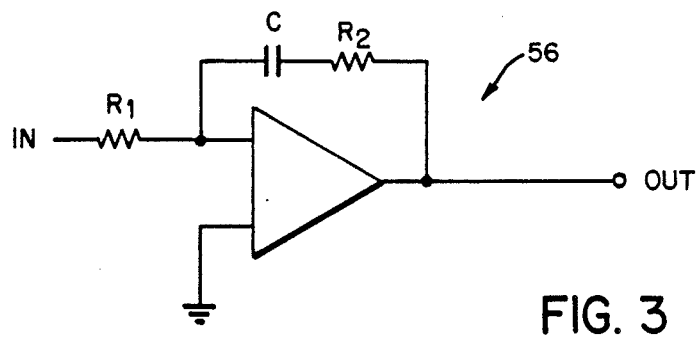
Figure 4:
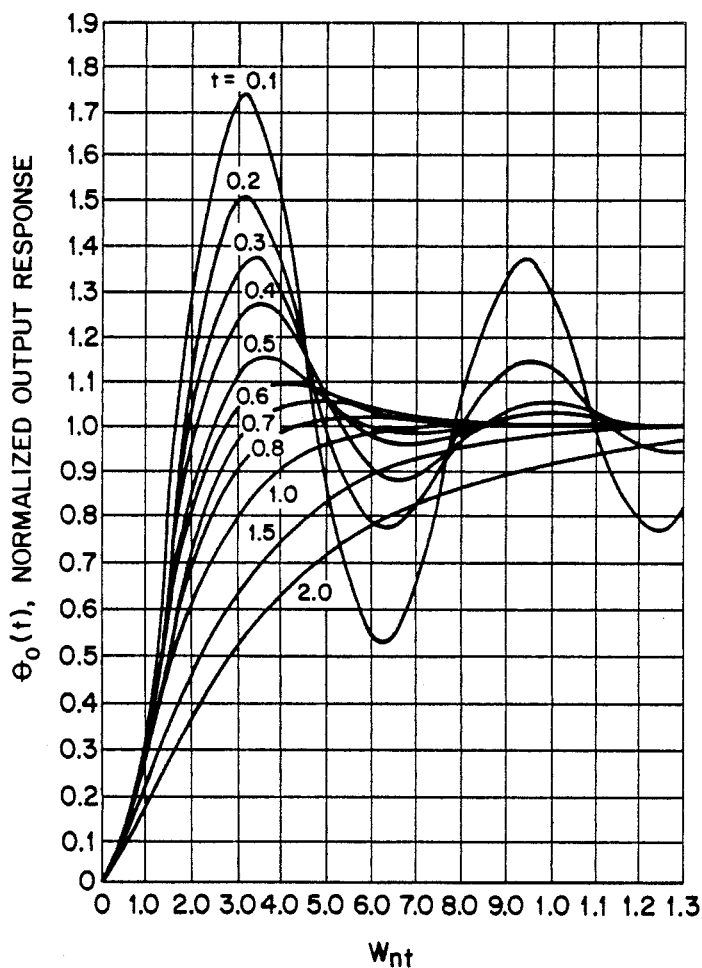
FIG. 4 is a graphical illustration of the loop response of the prior art phase locked loop shown in FIG. 1 under different damping conditions.
Figure 5A:
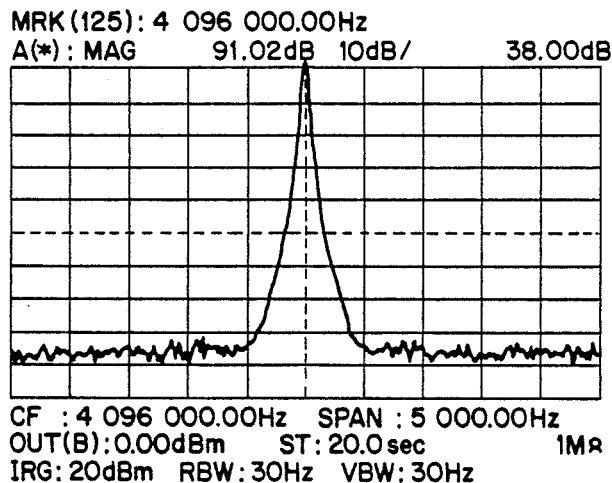
FIGS. 5A-5C are graphical illustrations of phase noise in different types of frequency synthesizers.
Figure 5B:
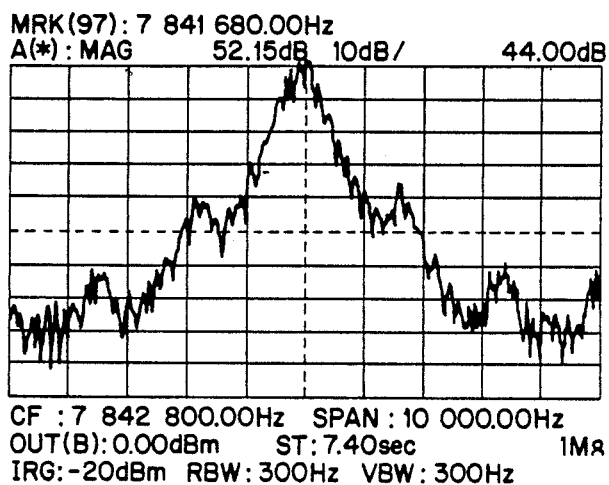
Figure 5C:
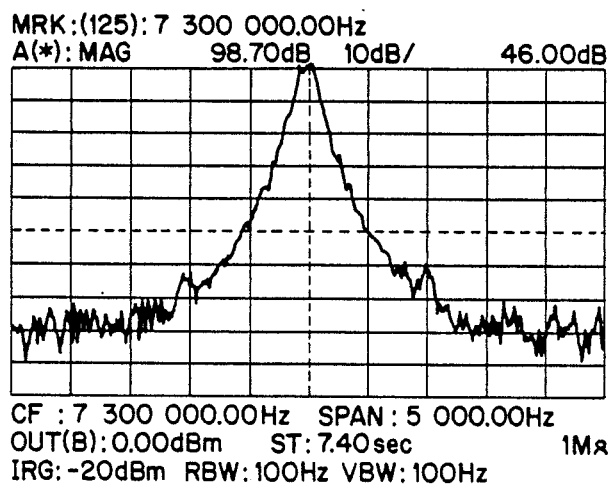
Figure 6:
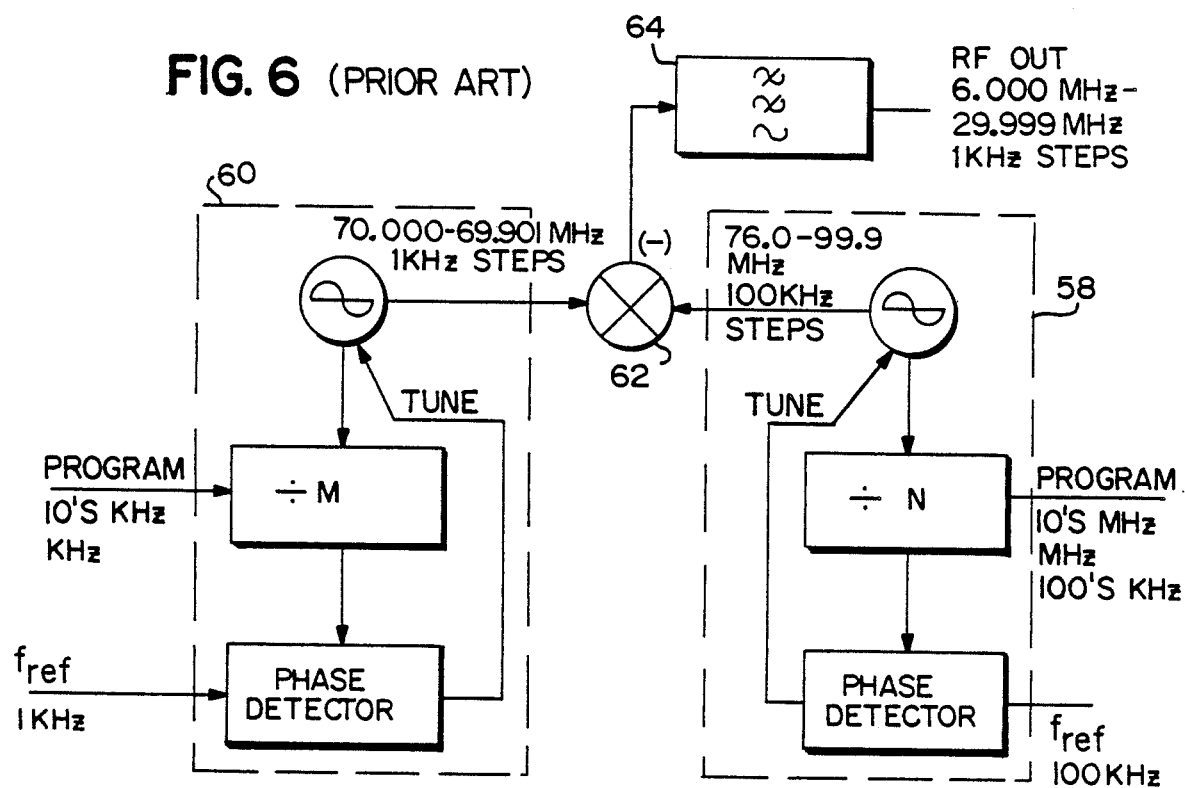
FIGS. 6 and 7 are schematic block diagrams of prior art dual phase locked loop frequency synthesizers.
Figure 7:
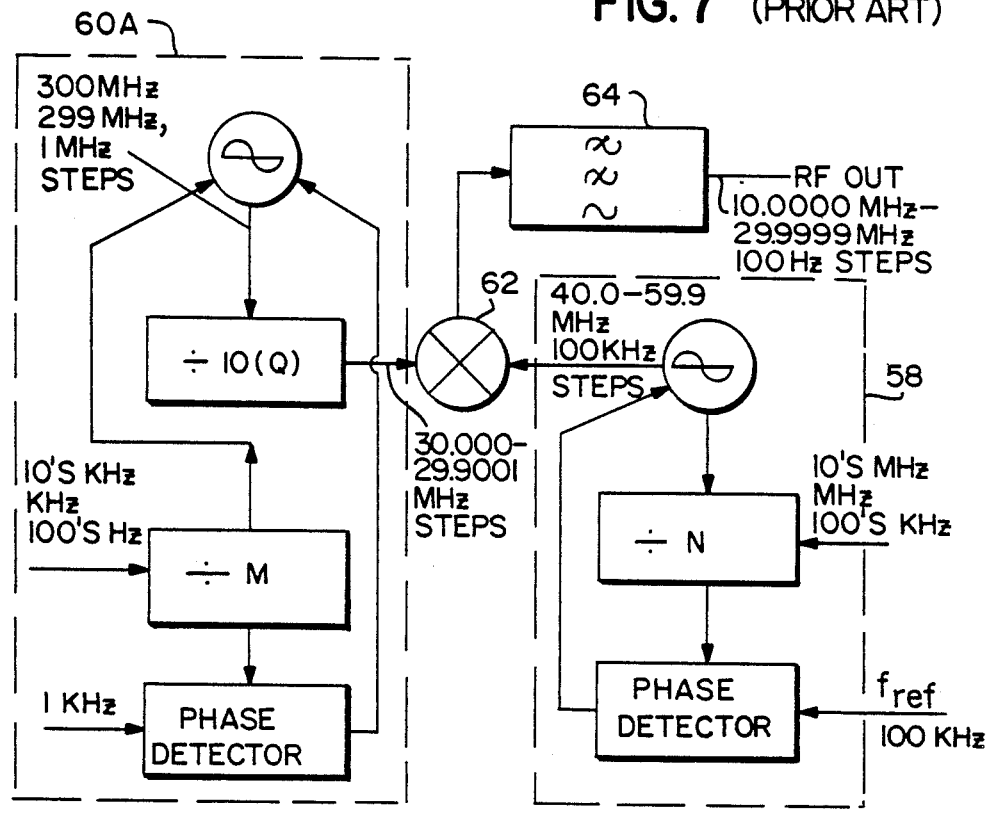
Figure 8:
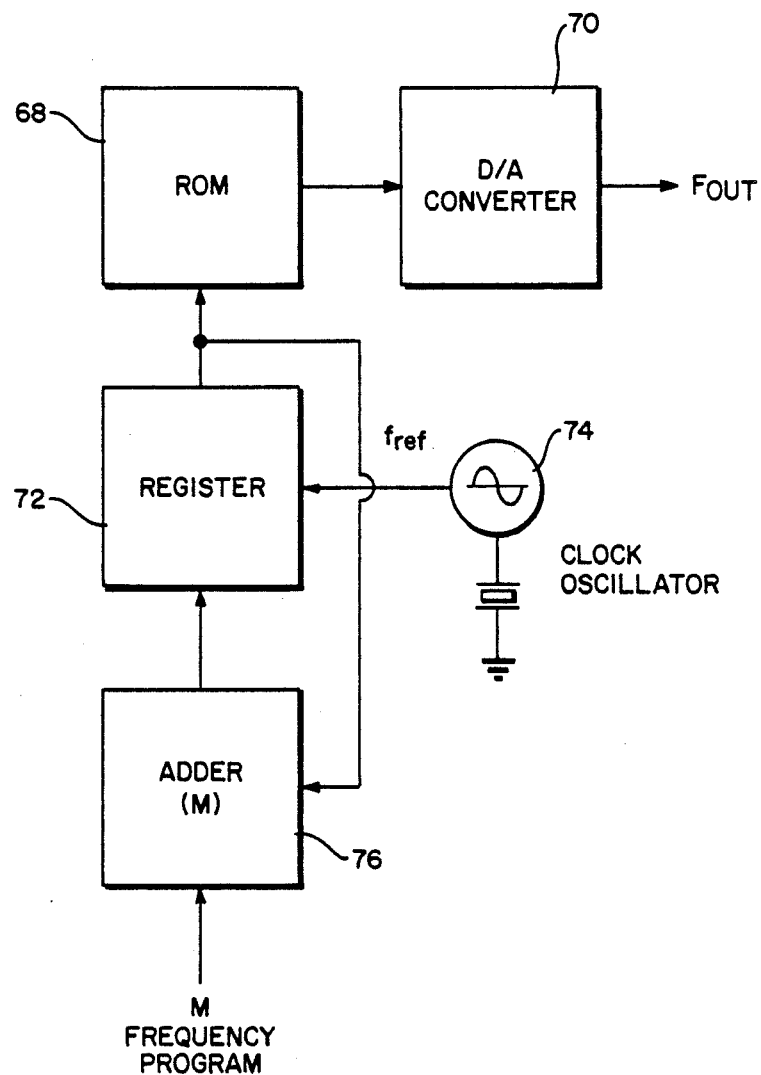
FIG. 8 is a schematic block diagram of a prior art direct numerical frequency synthesizer.
Figure 9:
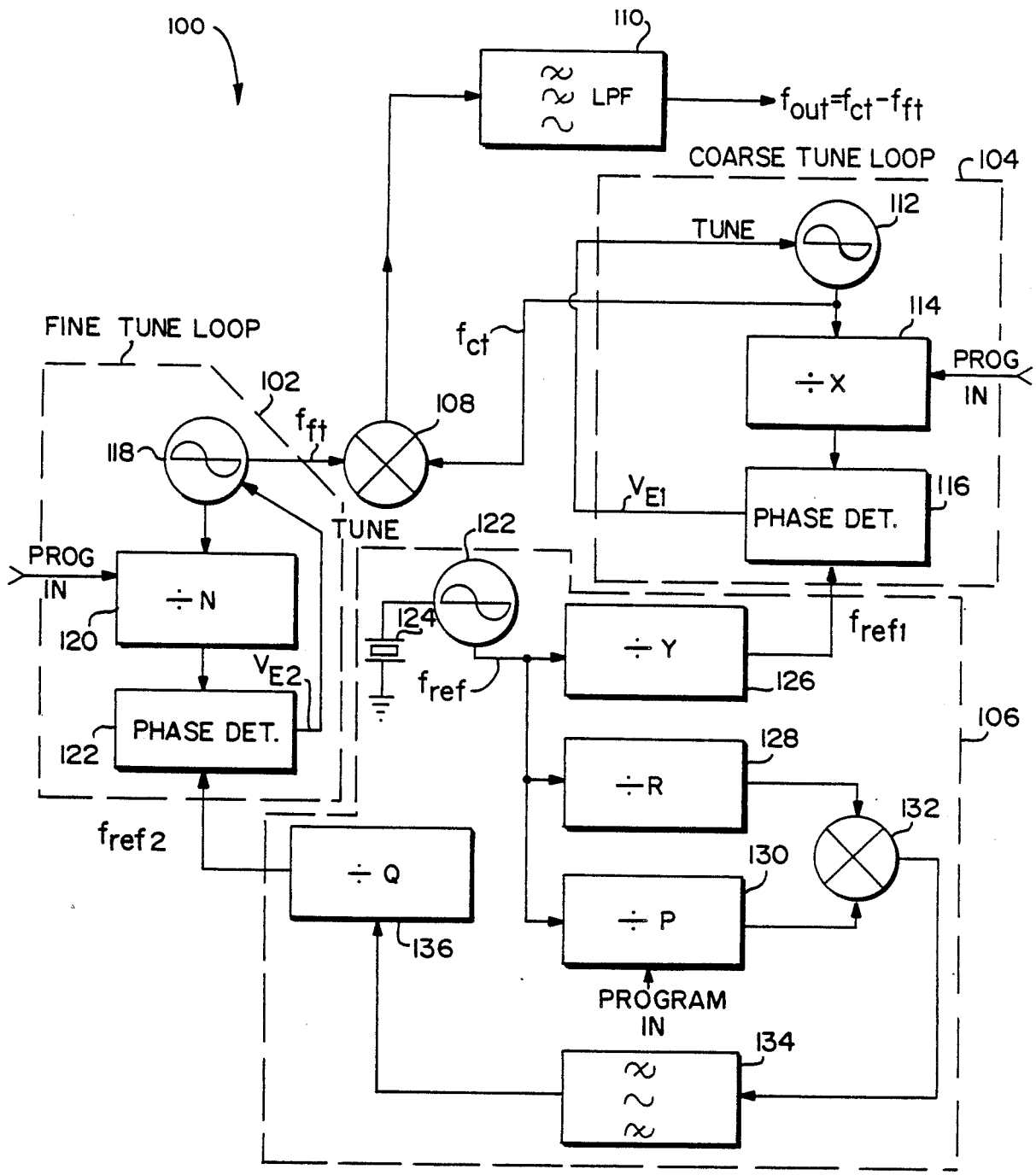
FIG. 9 is a schematic block diagram of a present preferred exemplary embodiment of a frequency synthesizer in accordance with the present invention.

FIG. 9 is a schematic block diagram of a presently preferred exemplary embodiment of frequency synthesizer 100 in accordance with the present invention. Frequency synthesizer 100 includes a fine-tune phase locked loop circuit 102, a coarse-tune phase locked loop circuit 104, a direct frequency synthesizer 106, a mixer 108, and a lowpass output filter 110. Coarse-tune PLL 104 provides a wide frequency range with broad frequency steps in the preferred embodiment. Fine-tune PLL 102 provides a narrow frequency range with finer resolution, but this resolution is still coarser than the desired frequency resolution of the synthesizer output. Both coarse-tune PLL 104 and fine-tune PLL 102 operate above the desired output frequency range in the preferred embodiment.

The output $F_{ft}$ of PLL 102 and the output $F_{ct}$ of PLL 104 are applied as inputs to mixer 108, which heterodynes the two output frequencies to produce a difference frequency selected by lowpass filter 110. The frequency range of the coarse-tune PLL 104 is nearly equal to the highest output frequency of synthesizer 100, and fine-tune PLL 102 has a frequency range sufficient to span the difference in frequency between adjacent frequency steps of the coarse-tune PLL 104.

The coarse-tune PLL 104 is a conventional phase locked loop circuit including a voltage controlled oscillator (VCO) 112, a programmable dividing counter 114 (which divides by the integer X in the preferred embodiment), and phase detector 116. Phase detector 116 compares the VCO 112 output frequency (divided by a factor X by divider 114) with an input reference frequency $f_{ref1}$ produced by direct frequency synthesizer 106, and produces an error voltage $V_{E1}$ at its output which is used to control the output frequency of VCO 112 in a conventional manner. Similarly, fine-tune PLL 102 includes a VCO 118 providing an output to a divider 120 (which divides by the programmable factor N in the preferred embodiment). Divider 120 provides the divided VCO 118 output frequency to the input of phase detector 122, which compares this divided output frequency with an input reference frequency $f_{ref2}$ produced by direct frequency synthesizer 106. Phase detector 122 produces an error voltage output $V_{E2}$ based upon this comparison and applies the error voltage to control the output frequency of VCO 118. The output frequency of the synthesizer is controlled by specifying the dividing factors X and N.

Fine-tune loop 102 loop reference frequency $f_{ref2}$ is considerably higher in frequency than the desired frequency resolution of synthesizer 100 in the preferred embodiment. The desired resolution of synthesizer 100 is obtained by slightly varying the frequency of $f_{ref2}$ using direct frequency synthesis. Using another phase locked loop to generate small variations in reference frequency $f_{ref2}$ would severely degrade the performance of synthesizer 100—since the additional PLL would itself require a very low reference frequency and consequently exhibit excessive lockup time.

Methods of reference frequency "pulling" were described by the inventor of the subject application in the 1981 and 1982 papers published in amateur radio magazines cited earilier in this application. These earlier frequency pulling methods relied on analog techniques to carefully adjust the frequency of the PLL reference oscillator. In contrast, direct frequency synthesizer 106 in accordance with the present invention does not produce an exact output frequency but only a close approximation. This "approximation" technique introduces errors in the output of synthesizer 100, but through various techniques these errors can be minimized and the performance of the synthesizer optimized to produce highly accurate output frequencies exhibiting predictable and minimal frequency error.

Direct frequency synthesizer 106 generates the reference frequencies $f_{ref1}$ and $f_{ref2}$ for input to the coarse-tune PLL 104 and the fine-tune PLL 102, respectfully, and also generates small variations in reference frequency $f_{ref2}$ to increase the effective frequency resolution of the fine-tune PLL. In the preferred embodiment, direct frequency synthesizer 106 includes a crystal oscillator 122 which produces a signal having a frequency $f_{ref}$. Frequency $f_{ref}$ is controlld by the characteristics of a piezoelectric crystal 124. Oscillator 122 output frequency $f_{ref}$ is applied to the inputs of three counter/dividers 126, 128 and 130 in the preferred embodiment.

Divider 126 divides $f_{ref}$ by a factor Y to produce coarse-tune PLL input reference frequency $f_{ref1}$ where:

$$f_{ref1} = f_{ref}/Y \quad (7)$$

(in the preferred embodiment, the divisor Y is fixed).

Divider 128 in the preferred embodiment divides reference frequency $f_{ref}$ by the factor R, and divider 130 divides the reference frequency by the factor P (in the preferred embodiment, R is fixed and P is programmable). The outputs of dividers 128 and 130 are applied to inputs of a mixer 132 which heterodynes the two output frequencies together. Lowpass filter 134 selects the sum frequency produced at the output of mixer 132 in the preferred embodiment and passes it along to the input of a further divider 136 which divides the sum frequency by factor Q (also fixed in one preferred embodiment). The output of divider 136 is used as reference frequency $f_{ref2}$ and applied to the input of fine-tune PLL 102.

If filter 134 is tuned to the sum frequency from mixer 132, the frequency $f_{ref2}$ is given by $$f_{ref2} = \frac{f_{ref}}{Q}\left(\frac{1}{R} + \frac{1}{P}\right) \quad (8)$$

and the output frequency $f_{ft}$ of fine-tune PLL 102 is given by $$f_{ft} = N f_{ref2} \quad (9)$$

Taking the partial derivative of the output frequency of the fine-tune PLL 102 with respect to P results in the following relation:

$$\frac{\partial f_{ft}}{\partial P} = \frac{-N f_{ref}}{Q}\left(\frac{1}{P^2}\right) \quad (10)$$

A variation of input reference frequency $f_{ref2}$ applied to the input of fine-tune PLL 102 will produce a variation in the output frequency of the fine-tune PLL equal to N $f_{ref2}$. This is determined by taking the partial derivative of the output frequency relative to the reference frequency as described in Equation 11 below:

$$\frac{\partial f_{out}}{\partial f_{ref}} = \frac{d}{df_{ref}}(f_{ref} \cdot N) = N \quad (11)$$

To provide an acceptable method of varying the frequency for direct frequency synthesizer 106, the derivative of the fine-tune PLL 102 output frequency $f_{ft}$ relative to input reference frequency $f_{ref2}$ should be constant, but as Equation 11 indicates, the partial derivative is a function of N (which changes with desired output frequency). Thus, the variation in output frequency $f_{ft}$ depends on both the frequency of $f_{ref2}$ and on the divisor N. The divisor N in effect multiplies the change of $f_{ref2}$ resulting from a given change in input frequency $f_{ref2}$ so that the change in output frequency $f_{ft}$ increases with N as well as with $f_{ref2}$. This is the first approximation encountered in the design of frequency synthesizer 100 in accordance with the present invention. To optimally minimize output error, the variation of N relative to the value of N should be small—and/or the amount of change in $f_{ref2}$ may be made a function of N as well as P.

The variation of fine-tune PLL 102 output frequency $f_{ft}$ is a function of N, Q and P (see Equation 10)—and thus, divisors Q and P have an effect on the output frequency $f_{ft}$ as well. In the preferred embodiment, Q is kept constant and P is varied to effectively increase the resolution of fine-tune PLL 102. The actual value of Q has no effect on the accuracy of the output of synthesizer 100. The value of R is fixed and is selected to make design easier in the preferred embodiment.

Assume that P is a sum of a large constant K plus a smaller variable M such that $$P = K + M, \quad (12\,a)$$

where $$P >> M \quad (12b)$$

Substituting Equation 12a into Equation 10, the partial derivative becomes $$\frac{\partial f_{ft}}{\partial M} = -\frac{Nf_{ref}}{Q}\left(\frac{1}{K+M}\right)^2 \quad (13)$$

(where K is constant).

The variation of output frequency $f_{ft}$ should be constant for changes in M (M is an integer). To determine what restrictions may exist on the values of Q, M, N and K, a binary expansion of Equation 13 is taken and shown below as Equation 14:

$$\frac{\partial f_{ft}}{\partial M} = -\frac{Nf_{ref}}{QK^2}\left[1 - \frac{\partial M}{K} + 3\left(\frac{M}{K}\right)^2 \cdots \right] \quad (14)$$

If K is large relative to M, only the first two terms of the binary expansion need to be retained and Equation 14 becomes:

$$\frac{\partial f_{ft}}{\partial M} = -\frac{nF_{ref}}{QK^2}\left[1 - \frac{2M}{K}\right] \quad (15)$$

The simplification of Equation 14 to Equation 15 by restricting K to be large relative to M is a further approximation of a direct synthesis technique performed by direct frequency synthesizer 106 and is a feature of the present invention. That is, one factor M is changed in only small amounts relative to the value of P in order to minimize error.

Coarse-tune loop 112 in the preferred embodiment is a conventional phase locked loop and does not contribute to any frequency error. The actual values of N, P, Q, R, X and Y are determined by the required frequency range and the ultimate frequency resolution of frequency synthesizer 100. To demonstrate the technique involved in selecting these parameters, the exemplary embodiment shown in FIG. 9 will be described in greater detail for a specific range of operating frequencies.

Suppose frequency synthesizer 100 is to have an output frequency range extending the decade from 3.000000 MHz to 29.999995 MHz with five hertz step output resolution. To provide a 30 MHz output frequency requires the fine-tune PLL 102 and the coarse-tune PLL 104 to both operate above 30 MHz in the preferred embodiment. In one exemplary arrangement, coarse-tune PLL 104 has a frequency range of 54.0 MHz to 80.9 MHz and fine-tune PLL 102 has a range from 51.000000 MHz to 50.900005 MHz. The resolution of coarse-tune PLL 104 in this exemplary arrangement is 100 kHz, while the fine-tune PLL 102 has a resolution of 5 Hz. Operating frequencies not including an exact multiple of 10 MHz are preferred to minimize internal beating effects with the output frequency $f_{ref}$ from oscillator 122—which is exactly 10.000000 MHz in this exemplary arrangement. In addition, the choice of 51.000000 MHz for the upper range of fine-tune loop 102 tends to minimize frequency errors (as will be discussed shortly).

The output frequency of synthesizer 100 is given by $$f_{out} = f_{ct} - f_{ft} = \frac{f_{ref} \cdot X}{y} - \frac{f_{ref}}{Q} N\left(\frac{1}{R} + \frac{1}{P}\right) \quad (16)$$

Because the output frequency $f_{out}$ is defined as the output of the coarse-tune loop 104, $f_{ct}$ minus the output of fine-tune loop 102, $f_{ft}$ in the preferred embodiment, a decrease in the frequency of $f_{ft}$ causes an increase in output frequency $f_{out}$.

As discussed previously, it is desirable to minimize the overall phase noise output of frequency synthesizer 100. In a multiple-loop frequency synthesizer such as synthesizer 100, it is desirable that the noise contributions from each loop be similar. The following condition must be satisfied if the noise contribution of fine-tune PLL 102 in the FIG. 9 embodiment is to be approximately equal to the noise contribution of coarse-tune PLL 104:

$$\frac{K_{VCO112} \cdot f_{ft}}{f_{ref1}} = \frac{K_{VCO118} \cdot f_{ct}}{f_{ref2}} \quad (17)$$

where $K_{VCO112}$ is the constant of VCO 112, and $K_{VCO118}$ is the constant associated with VCO 118.

In the exemplary arrangement, the coarse-tune PLL 104 has a reference frequency $f_{ref1}$ of 100 kHz, a total tuning range of 27.0 MHz and a mean frequency of 67 MHz. To evaluate Equation 17, assume $K_{VCO112}$ is equal to 2 MHz/V. The fine-tune PLL 102 has a tuning range of 99.995 kHz, $K_{VCO118}$ is equal to 2 MHz/V, and the mean frequency of VCO 118 is 50.95 MHz. The missing parameter is the reference frequency $f_{ref2}$ for fine-tune PLL 102. Solving Equation 17 for $f_{ref2}$ results in $f_{ref2} = 761$ Hz. In the exemplary arrangement, $f_{ref2}$ is chosen to be 1000 Hz for convenience, this frequency being sufficiently close to 761 Hz to ensure an equal contribution to synthesizer 100 output phase noise by each of the two loops 102, 104.

For the sake of convenience, the value of R is set to 10 and the reference frequency $f_{ref}$ is set to 10 MHz. For a fine-tune loop 102 reference $f_{ref2}$ of 1 kHz, the (divisor N of divider 120) spans from 51,000 to 50,901 (corresponding to 51.000 MHz down to 50.901 MHz in one kilohertz steps). This range and resolution represent the 1 kHz digit and the 10 kHz digit of synthesizer 100. The 5 Hz, 10 Hz and 100 Hz digits are below the frequency resolution of fine-tune PLL 102 and in the preferred embodiment are generated by varying the divisor P of divider 130. Divisor P must thus be chosen to produce a step size of 5 Hz for the exemplary design criteria established.

The range of values of Q and P may be determined by the setting partial derivative of the fine-tune loop 102 output frequency $f_{ft}$ relative to N to very close to 1 kHz. Taking a partial derivative of Equation 9 with respect to N and setting it equal to negative 1 kHz produces the following:

$$\frac{\partial f}{\partial N} = -\frac{f_{ref}}{Q}\left(\frac{1}{R} + \frac{1}{P}\right) = -1 \text{ kHz} \quad (18)$$

Substituting R=10 and $f_{ref}$=10 MHz into Equation 18 yields $$\frac{10^7}{Q}\left(\frac{1}{10} + \frac{1}{K+M}\right) = 10^3 \quad (19)$$

Solving Equation 13 for a step size of 5 Hz produces:

$$\frac{df_{ft}}{dM} = \frac{-51 \cdot 10^3 \cdot 10^7}{Q}\left(\frac{1}{K+M}\right)^2 = -5 \quad (20)$$

Solving Equation 20 for K+M, substituting that result into Equation 19, and solving for Q yields Q approximately equal to 1001. As Q must be an integer, the value of 1001 is chosen. Substituting this Q value back into Equation 20 yields K+M equal to 10,094. Since 200 frequencies are required with 5 Hz spacing to span the 1 kHz between the values of N, N will span from 000 to 199. Since the mean value P is 10,094, the value of 10,000 is selected for K (the nominal P value).

The design values have thus been chosen based upon practical and convenient values as well as for desired frequency range and resolution.

As was mentioned previously, the actual generated frequencies are approximations and are not exact. The magnitude of the errors introduced by these approximations will now be discussed.

There are generally two basic forms of error in any frequency synthesizer. The first type of error is an absolute error—that is, the difference in frequency between the output of the synthesizer and the desired (programmed, or "dialed in") frequency. The other type of error is a frequency increment error—or the variation in frequency spacing between adjacent frequency steps over the range of output frequencies. An ideal synthesizer produces an output frequency exactly equal to its programmed frequency, and has absolutely equal frequency step sizes across its entire operating range.

As an illustration of frequency increment error, suppose one frequency step of a synthesizer output were 4 Hz rather than 5 Hz and the next step increment were 7 Hz rather than 5 Hz. The absolute frequency error is only 1 Hz maximum (which would be insignificant at a high frequency such as 3 MHz), but the frequency increment error is 40%. In some applications low frequency increment error is as significant as low absolute frequency error.

In the exemplary arrangement shown in FIG. 9, the output frequency of synthesizer 100 may be calculated by substituting values into Equation 16 as follows $$f_{OUT} = \frac{10^7 X}{10^2} - \frac{10^7}{1001}\left[N\left(\frac{1}{10} + \frac{1}{10^4 + M}\right)\right] \quad (21)$$

and a desired (programmed) frequency is thus given by $$10^5 X - 10^3 N + 5M \quad (22)$$

The frequency error (assuming a perfect reference frequency) is given by the difference between the terms Equations 22 and 21 or $$\text{Error} = \frac{10^7}{1001}\left[N\left(\frac{1}{10} + \frac{1}{10^4 + M}\right)\right] - 10^3 + 5M \quad (23)$$

As can be seen from Equation 23, the frequency error is due only to the fine-tune loop 102 (being a function only of N and M). This is because coarse-tune loop 104 has an exact output frequency assuming a perfect reference frequency $f_{ref}$.

The frequency resolution of the exemplary synthesizer 100 is determined by the resolution of direct synthesizer 106. If a 5 Hz output resolution is desired, the direct synthesizer 106 must produce a change of $f_{ref2}$ that ultimately produces a change of 5 Hz of $f_{ft}$. In addition, the frequency range of direct synthesizer 106 must cause the fine-tune loop 102 to span the frequency difference between adjacent steps of fine-tune PLL 102 (1 kHz in the exemplary arrangement). Direct synthesizer 106 in the preferred embodiment has 5 Hz resolution with a range of 995 Hz—implying that M extends from 0 to 199. Evaluating Equation 20 for M=0, M=99 and M=199 (K=10,000), and N=51,000, N=50,950 and N=50,901 yields the result set forth in Table I.

TABLE I

| N | K + M | Frequency Step Size |
|---|---|---|
| 51,000 | 10,000 | 5.095 Hz |
| 51,000 | 10,100 | 4.995 Hz |
| 51,000 | 10,199 | 4.897 Hz |
| 50,950 | 10,000 | 5.090 Hz |
| 50,950 | 10,100 | 4.990 Hz |
| 50,950 | 10,199 | 4.892 Hz |
| 50,901 | 10,000 | 5.085 Hz |
| 50,901 | 10,100 | 4.985 Hz |
| 50,901 | 10,199 | 4.888 Hz |

As can be seen from Table I, the frequency increment is greater than the design value of 5 Hz for M=0, and becomes nearly exact at M=99 (the increment is exact for M=97). The frequency increment is smaller than 5 Hz for M=199. This implies that the maximum frequency error will occur at M=97 (or for programmed frequencies ending in about 500 Hz), and the error will be positive. The frequency increment error is much smaller than the absolute error, being largest for N=51,000 and smallest for N=50,901. The absolute frequency error increases as the programmed frequency increases above the even kHz values because the frequency increment is greater than the nominal 5 Hz. The absolute error continues to increase until a setting of about 500 Hz is reached, after which it begins to decrease by virtue of the frequency step of less than 5 Hz.

Figure 10:
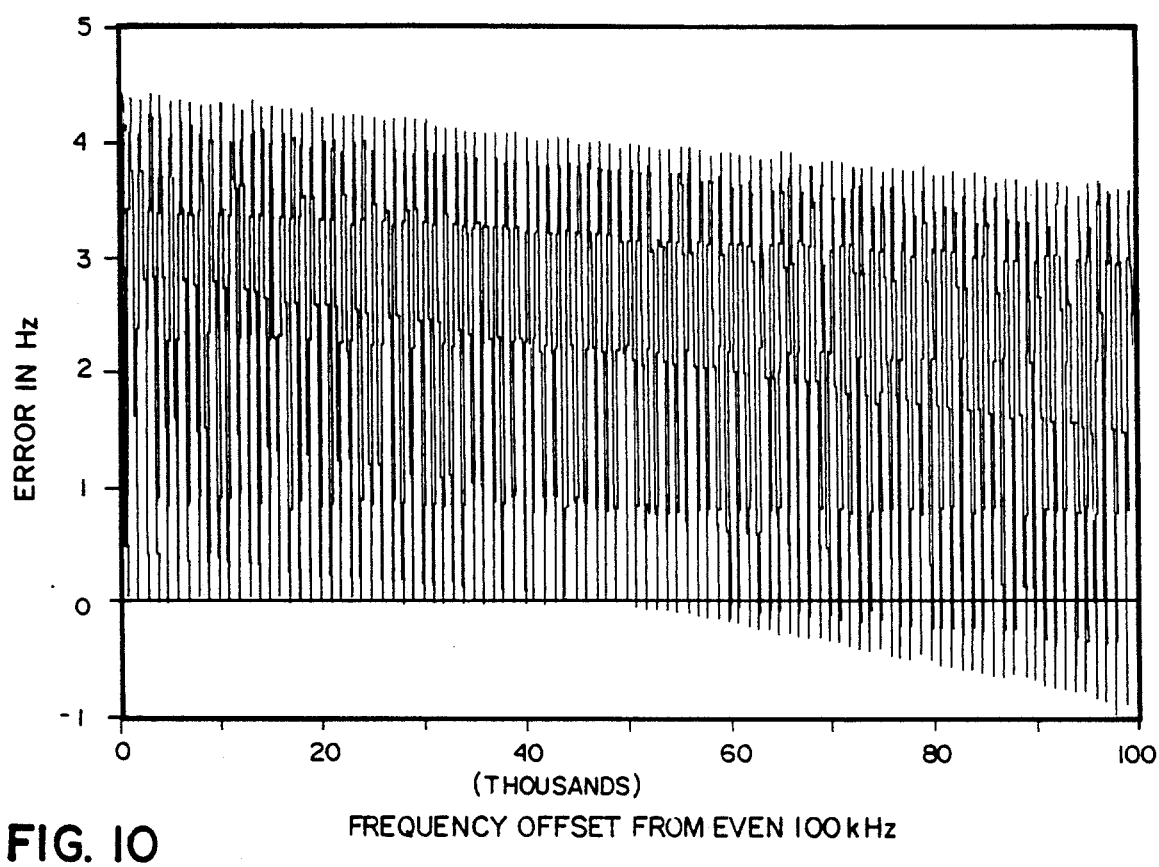
FIG. 10 is a graphical illustration of output frequency steps produced by the synthesizer shown in FIG. 9.
Figure 11A:
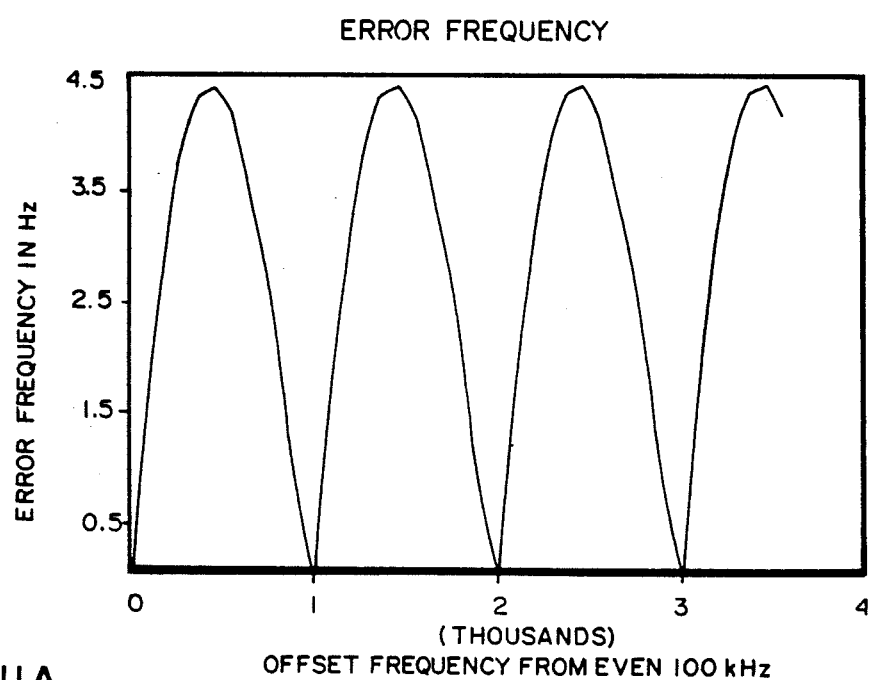
FIGS. 11A-11C are graphical illustrations of output frequency errors produced by the synthesizer shown in FIG. 9.
Figure 11B:
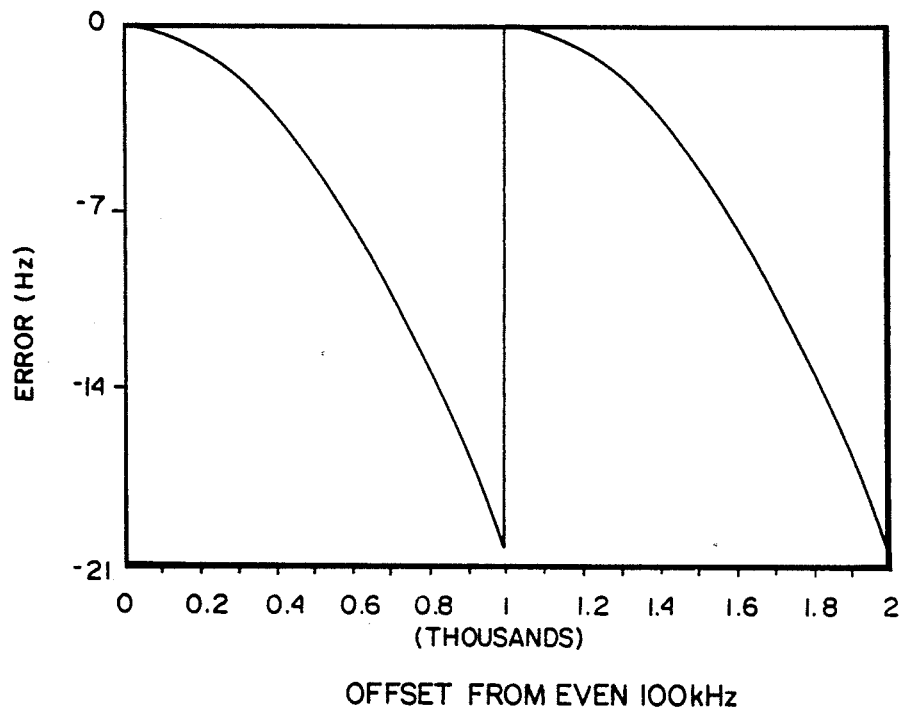
Figure 11C:
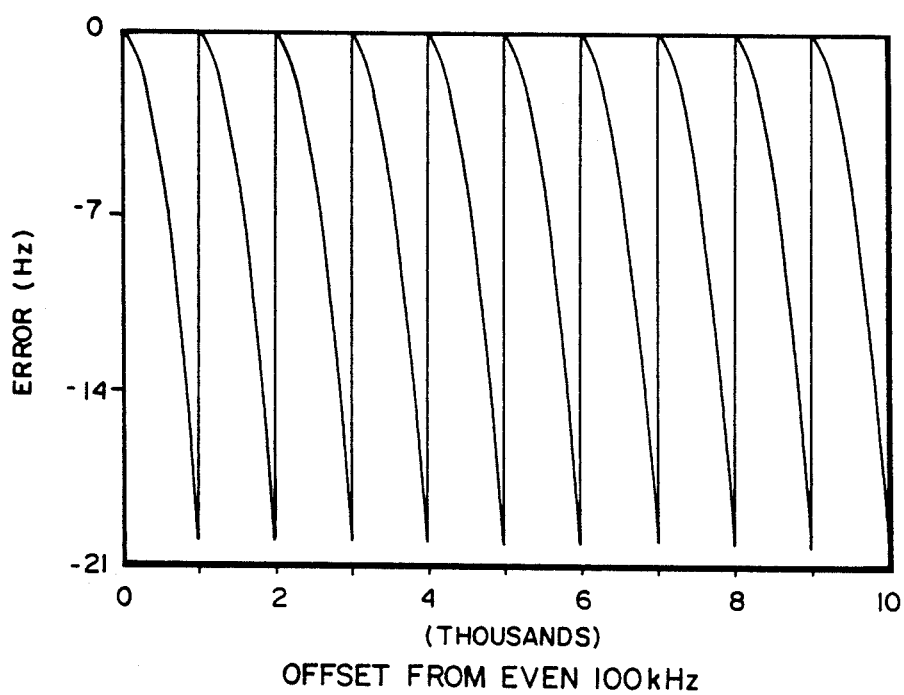

To gain an insight into the absolute frequency error, the frequency of fine-tune PLL 102 can be subtracted from the desired frequency to obtain actual frequency error. The results of a computer analysis of this subtraction for the exemplary arrangement are plotted in FIGS. 10–11C. The error for the entire 100 kHz range of fine-tune PLL 102 is shown in FIG. 10, and the error for approximately a 3.5 kHz segment of the fine-tune PLL range is shown in FIG. 11A. As can be seen, the error approaches a maximum of about 4.5 Hz for frequencies which are odd multiples of 500 Hz, and returns to nearly zero for frequencies which are multiples of 1 kHz. The error generally decreases as N decreases—decreasing the frequency error by about 1 Hz at the bottom of the range of synthesizer 100.

As predicted, the frequency at even kilohertz values is exact as a frequency spans between the even kilohertz, the error approaches a maximum at 500 Hz offsets, and returns to the exact frequency again at the next kilohertz integer multiple.

The value of N affects error function. Error values corresponding to N values extending from 50,000 to 49,901 are shown FIGS. 11B and 11C. It can be seen from the plots that the error function changes dramatically for this new range of N (as compared to the FIGS. 10 and 11A plots for N=50,950 to N=50,901), reaching a maximum of −21 Hz at the even kilohertz value. The absolute error has also become significantly greater, but the severe discontinuities are still more distressing which occur at the points where N changes. The discontinuities arise because the output frequency is exact at M equals zero for any value of N. To prevent a discontinuity between the values of M=199 and M=0 (when N changes by 1), the error at M=199 must be small. To determine an optimum value for N, the error value on the left-hand side of Equation 23 may be set to zero and M=199 substituted into this equation, and the equation solved for N. Using this technique, a value of N=50,987 minimizes the discontinuity at M=100.

The error calculated thus far has been relative to the fine-tune PLL 102, which is the only loop in synthesizer 100 which gives rise to errors. The maximum error of +4.5 Hz and −1 Hz are relative to the nominal 50.95 MHz fine-tune loop frequency in the exemplary embodiment. This maximum error is less than 0.1 parts per million (PPM). The output of fine-tune loop 102 is heterodyned with the output of coarse-tune loop 104, and the difference frequency is used in the exemplary embodiment as the output of synthesizer 100. The frequency error of the fine-tune loop 102 is therefore translated directly to the output of synthesizer 100 and, depending upon the output frequency, the +4.5 and −1 Hz errors may become a more significant percentage of the output frequency. In the exemplary arrangement, the frequency range is to be 3 MHz–30 MHz–producing a worst case error of 4.5 Hz at an output frequency of 3.000500 MHz. This 4.5 Hz error amounts to only 1.5 PPM at this lowest frequency. The error reduces to 0.15 PPM at 30 MHz. This is a very acceptable error for many applications. As can be seen, the approximation feature of the present invention results in extremely small errors when the design criteria are carefully selected and optimized to minimize error.

Techniques for further reducing the error, increasing the resolution and increasing the frequency range of synthesizer 100 will now be discussed. These techniques may be required for the design of especially critical frequency synthesizers requiring, for example, a frequency range which covers low frequencies and/or very low absolute and increment frequency errors.

Needless to say, the output frequency $f_{out}$ of synthesizer 100 is a function of reference frequency $f_{ref}$ produced by oscillator 122. Minor changes in $f_{ref}$ may be used to correct the small amounts of error introduced by the approximations within synthesizer 100. Taking the partial derivative of $f_{out}$ (see Equation 16) relative to $f_{ref}$ yields the following relation:

$$\frac{\partial f_{OUT}}{\partial f_{ref}} = \frac{X}{Y} - \frac{N}{Q}\left[\frac{1}{R} + \frac{1}{K+M}\right] \quad (24)$$

Thus, the variation of output frequency $f_{out}$ relative to the reference frequency $f_{ref}$ is a function of three variables: X, N and M (divisors Y, R and the K component of the P divisor being kept constant in the exemplary arrangement). The variation of N in the exemplary arrangement is relatively small, being on the order of 0.2%. The variation of (K+M) when combined with the 1/R term within the brackets of Equation 24 results in variation of less than 0.02%. The value X (the divisor of coarse-tune PLL 114), on the other hand, varies by almost 1.6:1 and must be taken into account when using any variation of reference frequency $f_{ref}$ to effect error correction.

Figure 12:
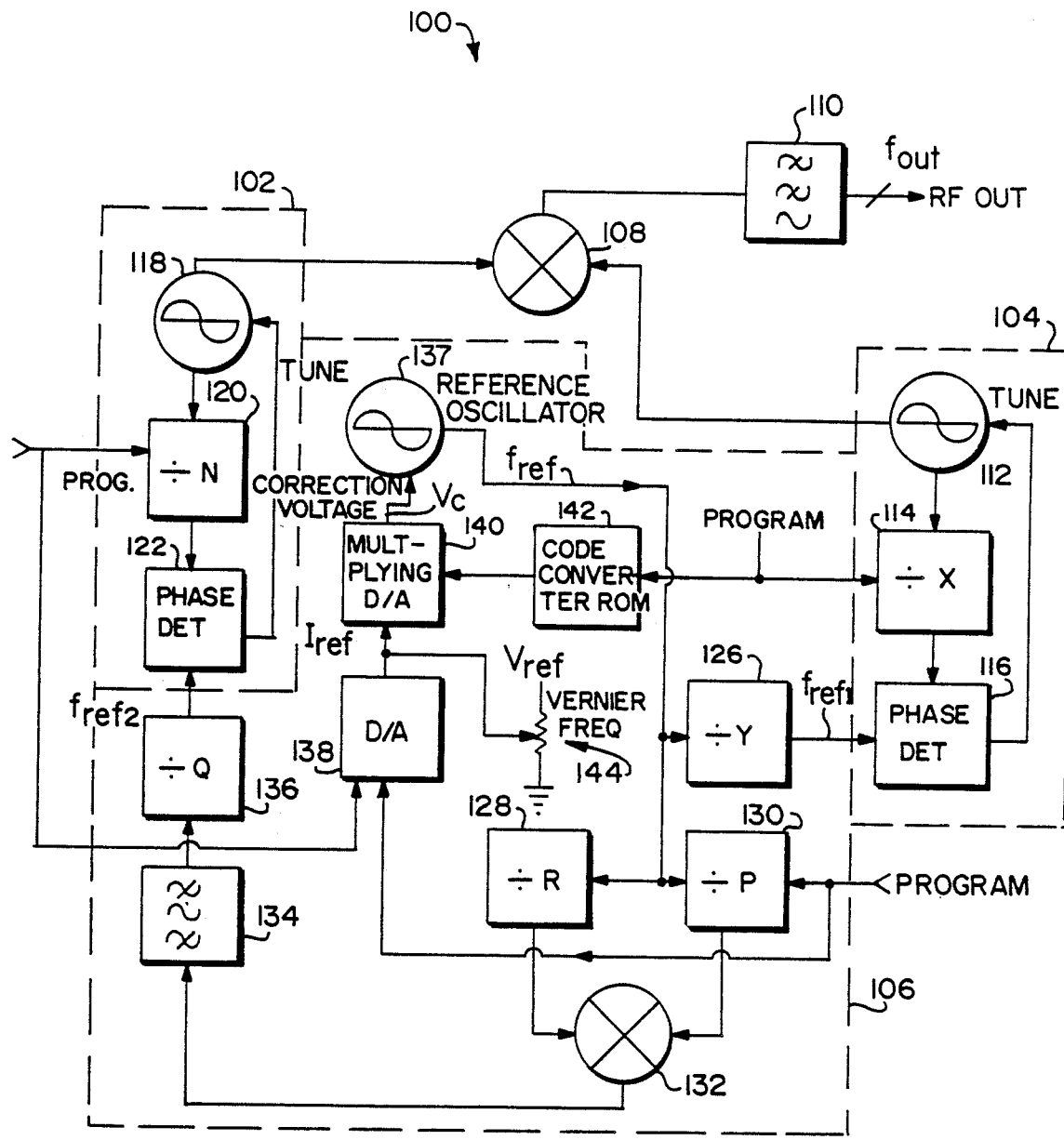
FIG. 12 is a schematic block diagram of a further exemplary preferred embodiment of a frequency synthesizer in accordance with the present invention, this further embodiment incorporating a reference oscillator error correction arrangement.

FIG. 12 shows a further exemplary arrangement in accordance with the present invention in which a voltage controlled crystal oscillator is used to introduce error correction (and thus optimize the performance of the synthesizer). Crystal oscillator 122 is replaced with a voltage controlled reference oscillator 137 which generates reference frequency $f_{ref}$ in response to a correction voltage applied to its input. The correction voltage is generated by a multiplying digital-to-analog (D/A) converter 140 which receives the output of a code converter ROM (read only memory) 142 and a reference current produced by a further D/A converter 138. Reference oscillator 137 must be extremely stable and is therefore preferably crystal controlled. The correction voltage produced by D/A converter 140 adjusts reference oscillator 137 output $f_{ref}$ slightly from its crystal controlled value in order to minimize the error in the output $f_{out}$ of synthesizer 100 and to augment the frequency resolution of the synthesizer.

The maximum amount of correction of reference oscillator frequency $f_{ref}$ is required in the worst case situation when X and (K+M) are at minimum values and N is at a maximum value (resulting in the least change of output frequency $f_{out}$ for a given change in reference frequency $f_{ref}$). In the exemplary arrangement being discussed, when the output frequency is at a minimum (i.e., X and K+M are at a minimum and N is maximum), the maximum error to be corrected is 1.5 RPM. In this worst case, Equation 24 reduces to 0.3 for the exemplary parameters discussed previously. Thus, to correct for an error of 4.5 Hz at 3 MHz, the correction of 5 PPM of reference frequency $f_{ref}$ is required. This amount of correction may be provided by several off-the-shelf commercially available voltage controlled crystal oscillators (e.g., part number M2002 manufactured by M. F. Electronics of New Rochelle, N.Y.).

It will be recalled that the frequency range of exemplary synthesizer 100 was limited to the decade from 3 MHz to 30 MHz. One reason for this limitation relates to the amount of correction that would be required for lower output frequencies. Suppose, for example, the lowest output frequency of synthesizer 100 were 300 kHz rather than 3 MHz. In this case, Equation 24 would result in a derivative of $f_{out}$ with respect to $f_{ref}$ of 0.03. The error due to the fine-tune loop would still be 4.5 Hz, which is 15 PPM relative to 300 kHz. The amount of correction to $f_{ref}$ required, however, would now be 500 PPM rather than merely 5 PPM. A 500 PPM correction of the frequency produced by a crystal oscillator is generally not possible because of the high Q of the crystal and other factors. Consequently, as the synthesizer output frequency decreases, error correction by "pulling" a crystal controlled oscillator frequency becomes more difficult. The alternative of using a reference oscillator which is not crystal controlled is not attractive in most applications because of the resulting loss of long and short term stability.

Controlled shifting of reference oscillator 137, may also be used to increase the resolution of frequency synthesizer 100 by adding an additional "half decade"

of frequency control. A 1 Hz resolution decade (which "fills in" between the 5 Hz steps provided by fine-tune PLL 102 and associated dividers 120, 130 and 136) requires a 4 Hz maximum offset (1.33 PPM at the minimum output frequency of 3.000 MHz in the exemplary arrangement). Such correction requires a shift in reference frequency $f_{ref}$ of 4.4 PPM. Because this extra "half decade" requires the reference frequency to be *raised* to provide four additional 1 Hz steps while the frequency correction for error requires a maximum *reduction* in the output frequency of 4.5 Hz (1.5 PPM), a frequency variation of plus or minus 5 PPM of reference frequency $f_{ref}$ provides the necessary correction. The amount of variation in the output frequency $f_{out}$ for variation of the reference frequency $f_{ref}$ (as given by Equation 24) is primarily a function of X. This is because the second term in Equation 24 is small compared to the value of the first term (at least in the exemplary arrangement described) with optimized parameters. Consequently, the second term may be considered a constant and the correction applied to reference oscillator 137 can be adjusted for the value of X only (the mean value of the second term for particular design parameters may be used as a basis for the calculation).

One way to adjust for the value X is to assume that the reference frequency $f_{ref}$ produced by voltage controlled crystal oscillator 137 is a linear function of the correction voltage applied to the input of the oscillator (this is a reasonably good assumption for most off-the-shelf voltage controlled crystal oscillators). In the preferred embodiment, the correction voltage applied to the input of oscillator 137 is attenuated as a function of X such that the variation in the output frequency is the same linear function of the correction voltage regardless of the value of X—thereby making the correction of $f_{ref}$ a function of X as required. In the exemplary embodiment shown in FIG. 12, this attenuation function is performed by multiplying D/A converter 140 and code converter ROM 142.

In the exemplary arrangement, the partial derivative of the output frequency relative to the reference frequency with the mean value of the $1/(K+M)$ factor substituted becomes:

$$\frac{\partial f_{OUT}}{\partial f_{ref}} = \frac{X}{100} - 0.305 \quad (25)$$

The partial derivative of the reference frequency relative to the correction voltage $V_c$ applied to the input of oscillator 137 is:

$$\partial F_{ref}/\partial V_c = K \quad (26)$$

Combining the two derivatives to obtain a relationship between the output frequency and the correction voltage yields:

$$\frac{\partial f_{OUT}}{\partial f_{ref}} \cdot \frac{\partial f_{ref}}{\partial V_c} = (X - 305) \cdot \frac{K}{100} \quad (27)$$

Multiplying D/A converter 140 corrects voltage $V_c$ by $(X-305)$ in the preferred embodiment to force the variation of output frequency $f_{out}$ as a function of control voltage $V_c$ to be a constant for any X value.

Since the output frequency, $f_{out}$, error is only a function of N and M, an error correction voltage is generated with D/A converter 138 from the values of N and M and fed to the input of multiplying D/A converter 140 in the preferred embodiment shown in FIG. 12. The extra half decade of resolution may be provided by simply applying an offset voltage (produced by vernier 144) to the input of the multiplying D/A converter 140. This additional half decade is calibrated in hertz (which represents a constant voltage change per hertz of dial calibration in the preferred embodiment). Because of the multiplying D/A converter 140, the absolute change in output frequency $f_{out}$ is a linear function of the correction signal (current $I_{ref}$) applied to the input of multiplying D/A converter 140.

Figure 13:
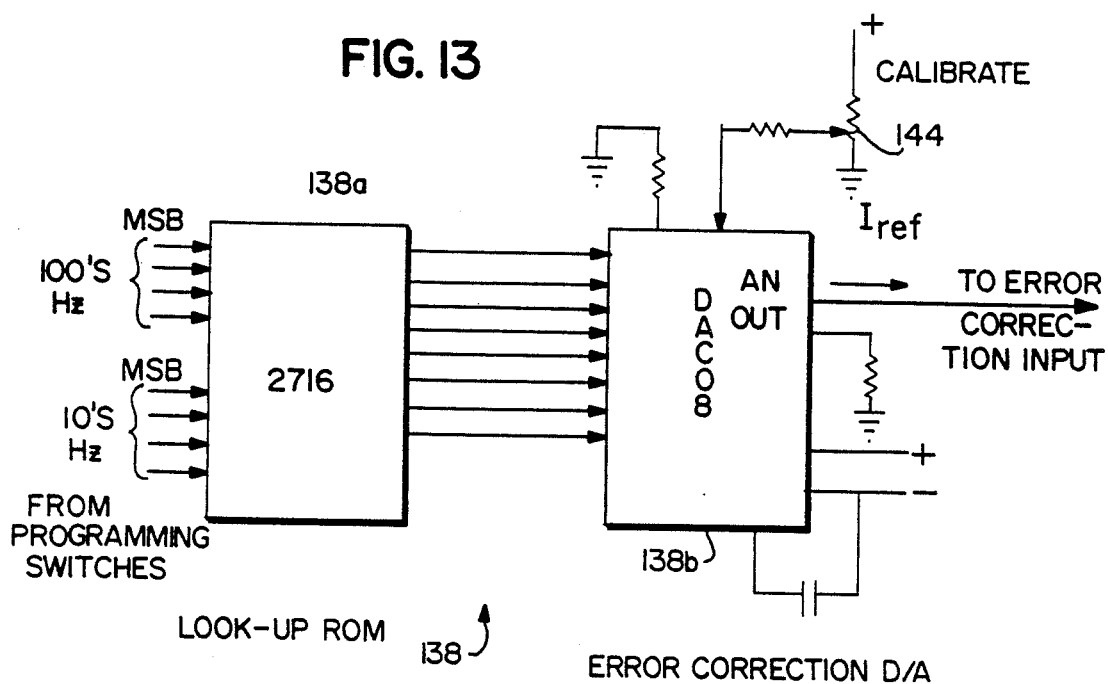
FIG. 13 is a detailed schematic diagram of the error correction D/A converter shown in FIG. 12.

The correction signal is generated in the preferred embodiment using a look-up ROM of the type shown in FIG. 13. More particularly, in the preferred embodiment, D/A converter 138 includes a ROM 138a the address inputs of which are connected to programming switches (or some other source of encoded frequency selection information) which determines the N and P(M) factors. The parallel data output of converter 138 is connected to the input of a conventional 8-bit D/A converter 138b. Converter 138b converts the data applied at its input to an analog output signal which is supplied to the input of multiplying D/A converter 140 in the preferred embodiment.

In the exemplary arrangement, there are 200 different values of M and 100 different values of N—implying that 20,000 values will be required to generate a correction of voltage for each possible frequency (i.e., each and every combination of M and N). However, 8 bits of resolution are sufficient for the correction voltage and in addition, the error function is smooth without serious discontinuities if the value of N is chosen carefully as previously explained. Thus, different correction voltages are specified by ROM 138 for only a portion of the total combinations of M and N. To effect a 10-fold improvement in error requires that the correction voltage $V_c$ have at least 4 bits of resolution. This resolution allows the error (which has a maximum of 1.5 PPM for the exemplary arrangement) to be corrected to within 1/16th of the maximum error—or approximately 0.1 PPM. Since the error is cyclic and repeats every 1000 Hz (see FIG. 11A) the same correction can be used for each 5 Hz, 10 Hz and 100 Hz digit. Thus, the correction look-up ROM 138a need only accept nine input signals from the programming switches and generate only 512 different correction values.

Figure 20:
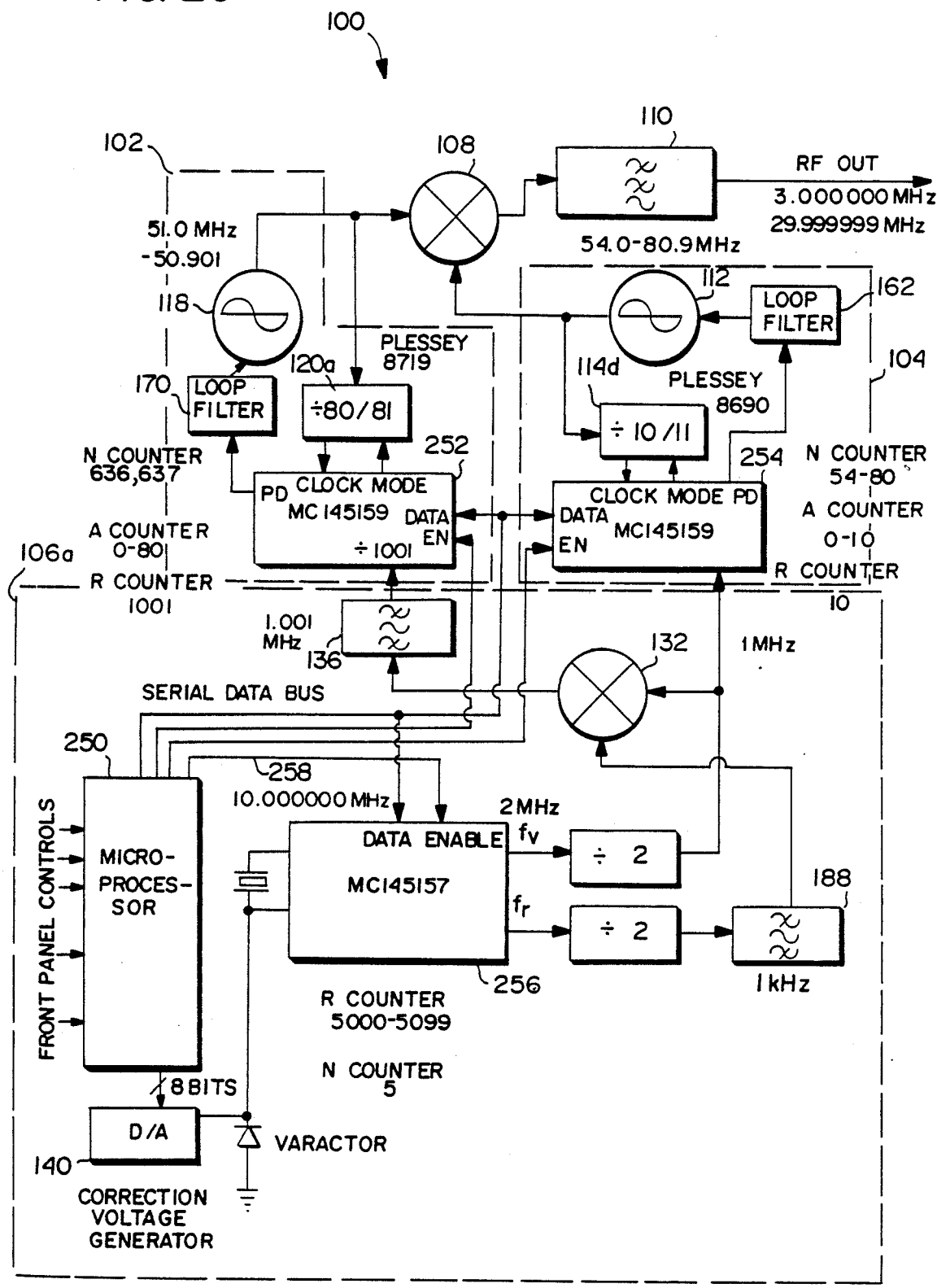
FIG. 20 is a schematic block diagram of a further, microprocessor controlled frequency synthesizer embodiment in accordance with the present invention.

FIG. 10 shows that there is a general reduction of the output frequency of about 50 to 100 kHz as the absolute frequency of the synthesizer output increases. Therefore, the kilohertz and 10th kHz digits might also address the look-up ROM 138a for an improved correction. The 5 Hz "half decade" and the 10 Hz decade (providing additional resolution for synthesizer 100) could be eliminated from the frequency correction and only the 10's kHz and 100's Hz decades used for frequency correction. This would produce a 10-fold improvement in frequency accuracy while requiring only a simple 2K×4 ROM 138a. An alternate arrangement uses a microprocessor instead of a look-up ROM to control error connections. This alternate arrangement is shown in FIG. 20 and will be discussed shortly.

FIGS. 15A-15H are together a detailed schematic diagram of a preferred implementation of the embodiment of frequency synthesizer 100 shown in FIG. 12. Because the embodiment shown in FIGS. 15A-15H was experimental during its development, discrete logic devices were used to permit more flexible design changes. However, it will be understood by those skilled in this art that a microprocessor could replace many of the discrete logic devices shown in these figures—and FIG. 20 is an alternate exemplary embodiment which includes a microprocessor-based controller. A microprocessor permits additional operational features to be added to synthesizer 100, such additional features including, for example, more sophisticated control functions and dynamic error calculation.

Figure 15A:
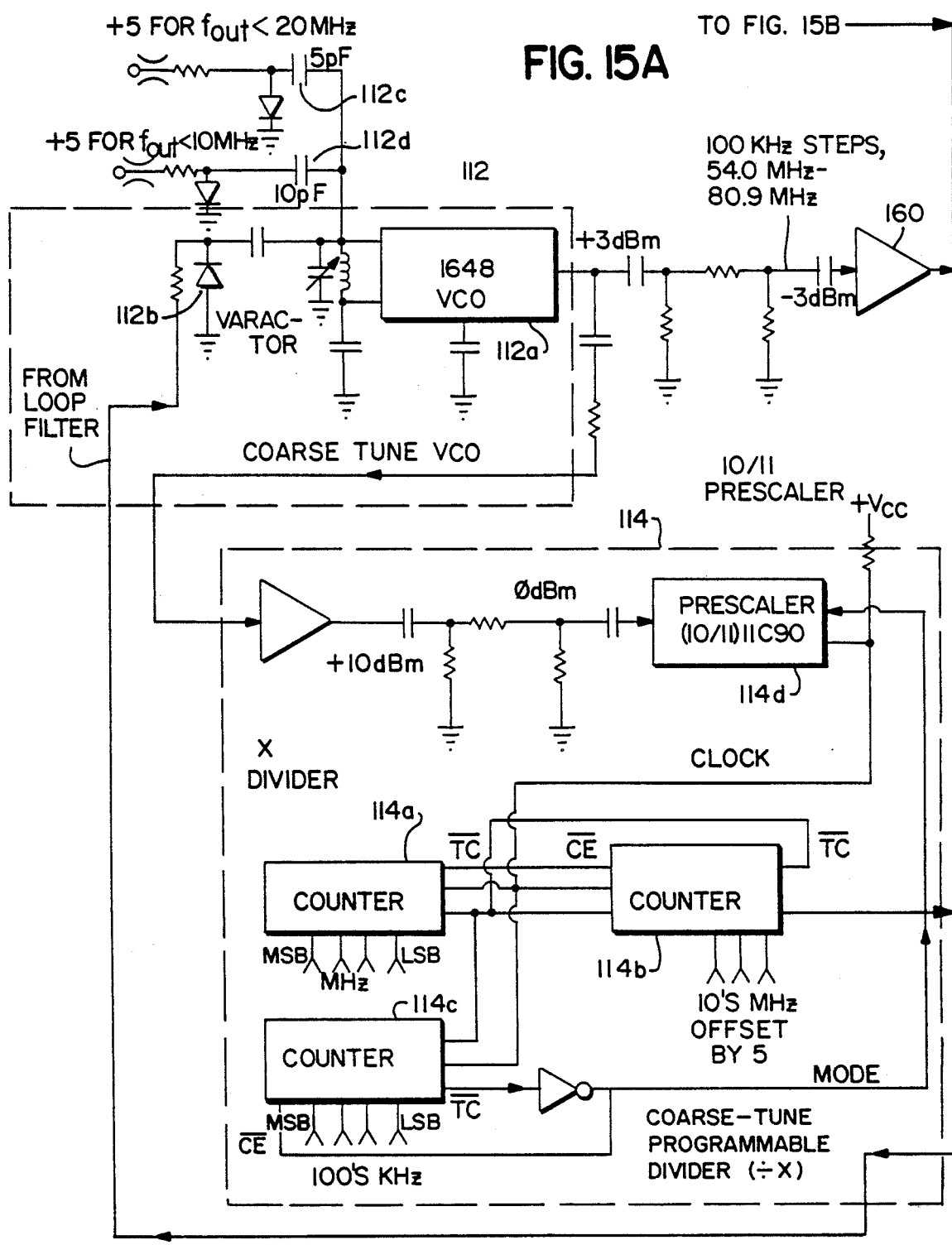
FIGS. 15A-15H are detailed schematic diagrams of the FIG. 12 frequency synthesizer.
Figure 15B:
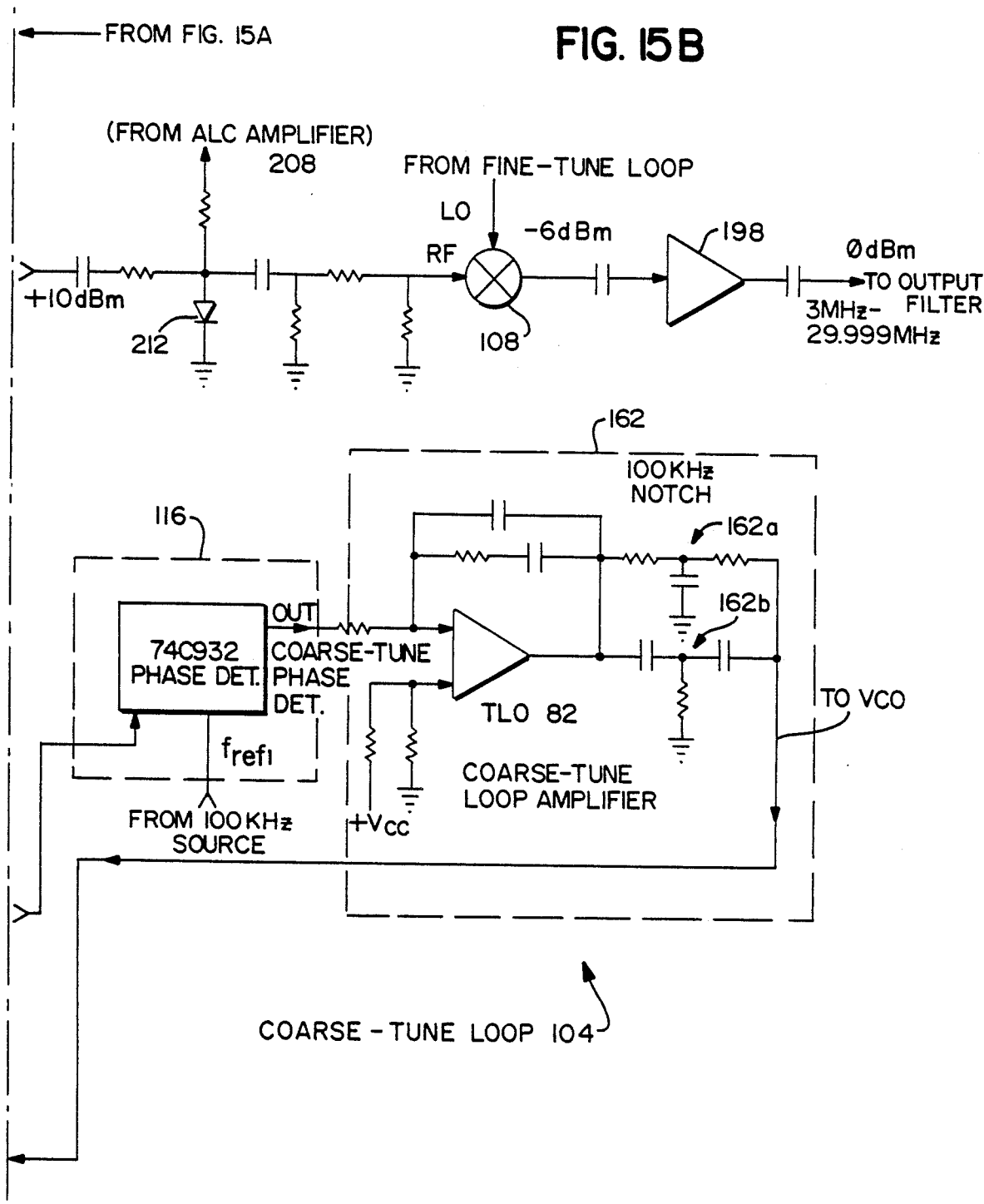

FIGS. 15A–15B are together a schematic diagram of coarse-tune loop 104 shown in FIG. 12. Coarse-tune loop 104 in the preferred embodiment operates from 54.0 to 80.9 MHz in 100 kHz steps and is programmed from the 10 MHz, 1 MHz and 100's kHz decades of a bank of manual frequency selector switches (not shown). A dual-modulus "pulse-swallowing" frequency divider 114 is used to divide by the factor X within the coarse-tune loop 104. Discrete counters 114a and 114b are preprogrammed to a preset J count value, countdown to 0, and then are reprogrammed again to the preset count after the zero state. This results in a division of J+1 (where J is the preset value). Normally, division by J+1 would be a detriment to the design of a programmable divider. However, this characteristic is used to advantage in the preferred embodiment.

A 10/11 dual modulus prescaler 114d is used in programmable divider 114 so that the 1 MHz and 10 MHz switches can be used to program the main counter while the 100 kHz may be used to program auxiliary counter 144c. Counters 144a, 114b, 114c are all BCD counters in the preferred embodiment so that no BCD-to-binary conversion is required. Because counters 114a, 114b divide by J+1, 1 MHz is added to the value presented to the programmable divider. Any programmable divider with a 10/11 capability could be used in this application, although the prescaler 114d (a Fairchild 11C90 integrated circuit) is used in the preferred embodiment because it is a readily available, proven part. The equivalent of 50 MHz may be added to the input of programmable divider 114 by simply rotating a 10's MHz control so that when the switch is set to 3.0 MHz, the output BCD code produced by divider 114 is 53.0 MHz. The additional 1 MHz added to programmable divider 114 by the J+1 counting of counters of 114a, 114b thus produces an output frequency of 54.0 MHz for coarse-tune loop 104. No code conversion or logic is required to obtain the correct frequency.

Voltage controlled oscillator 112 in the preferred embodiment includes an ECL voltage controlled oscillator integrated circuit 112a. VCO 112a is tuned with a varactor diode 112b and switched, fixed capacitors 112c, 112d. Band switching via the fixed switched capacitors 112c, 112d is used to limit the amount of phase noise created by VCO 112. The tuning range of VCO 112 was reduced by ⅓ of the desired range of 26.9 MHz to maintain the relationship of Equation 17 (accomplished by switching capacitors 112c, 112d with PIN diodes in the preferred embodiment). An alternate band switching arrangement might rely upon two separate VCOs at the cost of additional hardware. Even lower phase noise could be obtained using a high-performance FET or bipolar transistor oscillator, although one of the important advantages of one feature of the present invention is that rather high reference frequencies are used relative to the resolution of synthesizer 100—allowing inexpensive and simplified circuits to be used.

In the exemplary embodiment, VCO 112 covers the total range of 54 MHz-80.9 MHz in three bands: 54 MHz to 60.9 MHz (capacitor 112c and 112d connected), 61 MHz to 70.9 MHz (capacitor 112c connected), and 71 MHz to 80.9 MHz (neither of capacitors 112c, 112d connected)—corresponding to synthesizer 100 frequency ranges of 3 MHz, to 9.9 MHz; 10.0 MHz to 19.9 MHz; and 20.0 to 29.9 MHz, respectively.

Even though the VCO 112a used in the exemplary embodiment (a Motorola MC1648) has an internal buffer, noise from switching prescaler 114d caused sidebands to be formed. To reduce these sidebands to an acceptably low level, the output of VCO 112a is amplified and then attenuated by buffer amp 160 in the preferred embodiment.

VCO 112a must be adequately shielded and provided with sufficient isolation from mixer 108 to prevent the mixing products and the output of fine-tune 102 oscillator from disturbing the coarse-tune VCO 112. It was noted during testing that the oscillators of the two loops sometimes locked together when the frequencies involved were closer than a few kilohertz. Care must be taken to shield the oscillators from one another in order to prevent such undesired locking.

The output of programmable X divider 114 is taken from counter 114b to obtain the widest possible output pulse. This output pulse is fed to a three-state phase detector 116 (an off-the-shelf integrated circuit number 74C932 in the preferred embodiment).

Figure 16A:
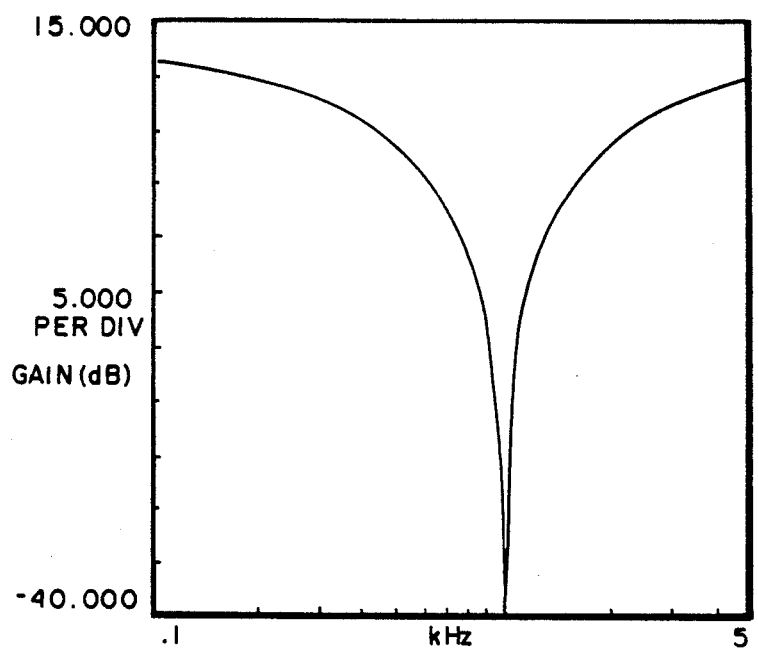
FIGS. 16A-16G are graphical illustrations of various measured and calculated performance characteristics of the FIG. 12 circuit.
Figure 16B:
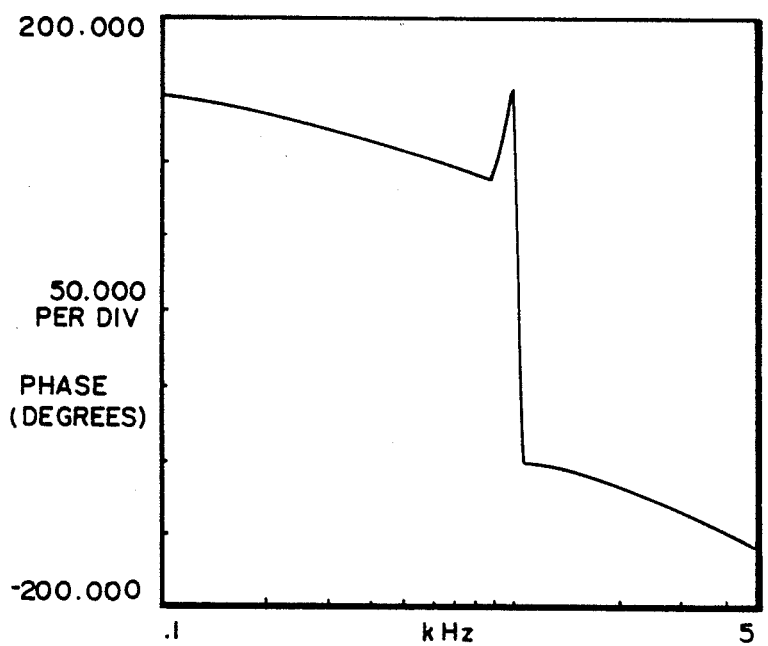

An active loop filter 162 is used with a twin-T filter 162a, 162b to reduce the sidebands caused by the reference frequency. FIGS. 16A and 16B show the gain and phase of loop filter 162, respectively. The measured constant of VCO 112 was an average 2 MHz/volt for all three bands. The constant of phase detector 116 is a function of the supply voltage and was 0.796 radians per volt in the preferred embodiment. The coarse-tune loop 104 natural loop frequency was calculated to be 0.55 Hz in the preferred embodiment with a damping factor of 3.13. The loop 3 dB bandwidth was 3.6 Hz and the noise bandwidth was 5.57 kHz. The approximate acquisition time of coarse-tune loop 104 was calculated as 0.232 seconds.

Figure 15C:
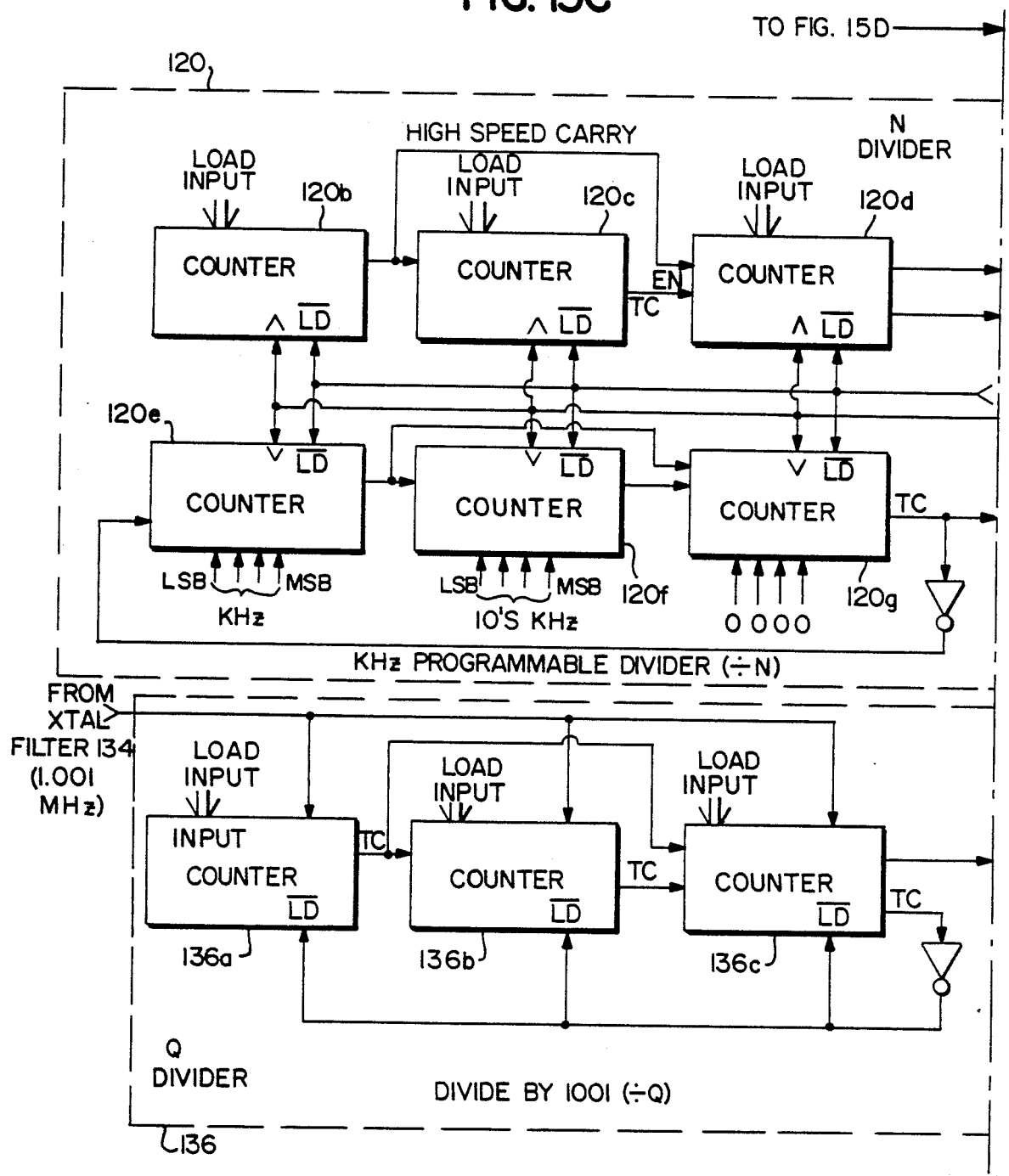
Figure 15D:
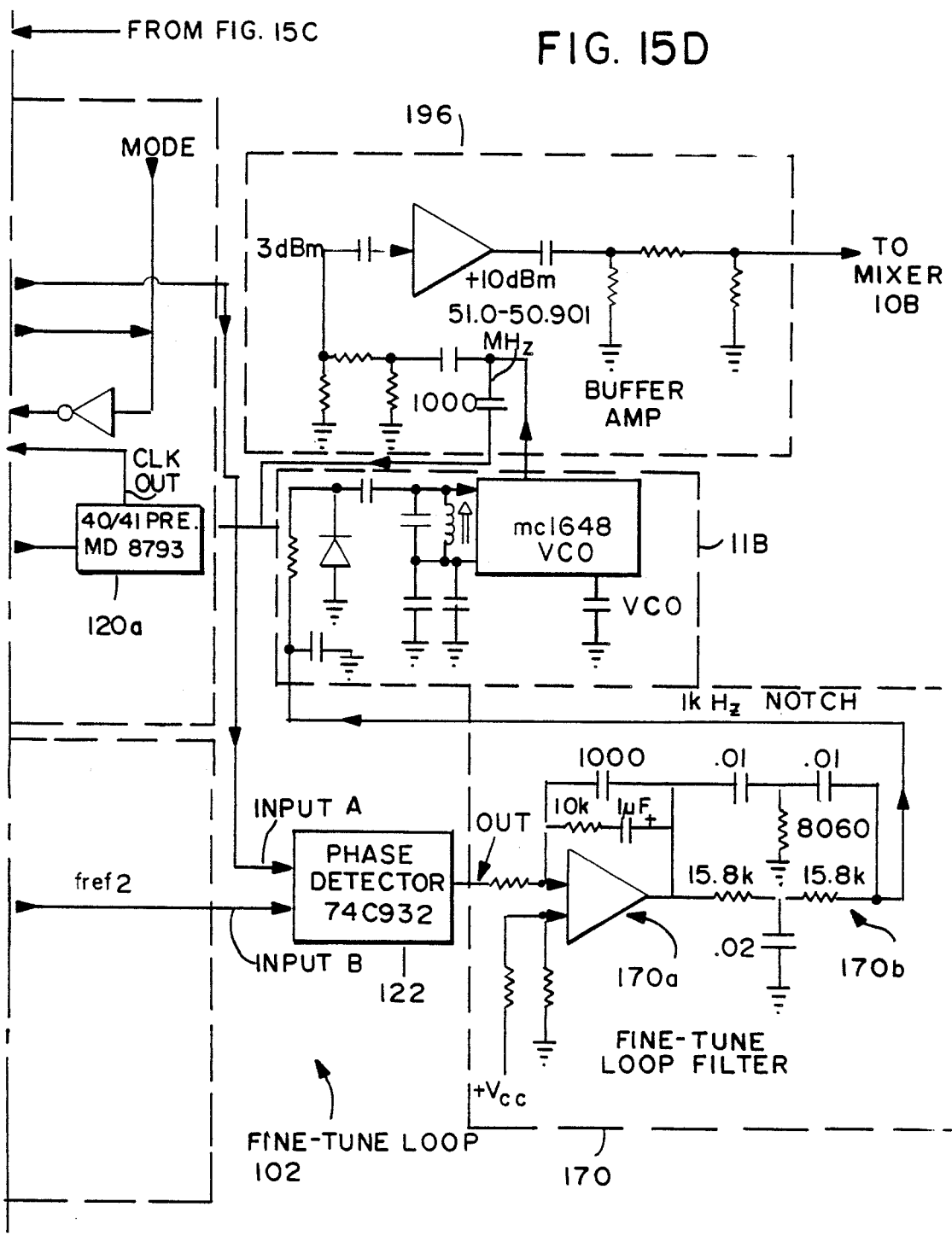

FIGS. 15C–D are together a detailed schematic diagram of fine-tune loop 102. A 40/41 prescaler 120a is used to provide a pulse-swallowing programmable divider 120 for dividing by the factor N. The divide-by-N counter 120 includes a bank of main counters 120b, 120c, 120d and a bank of auxiliary counters 120e, 120f, 120g in the preferred embodiment. Main counters 120b–120d are programmed to provide a fixed count of 1250. Auxiliary counters 120e–120g are each up decade counters and thus cause the values programmed in them to be subtracted from a maximum count state. Hence, in the preferred embodiment, programming of counters 120e–120g by an increased value results in a decrease in the division ratio. This feature is advantageous in the preferred embodiment since the actual output of frequency synthesizer 100 is the difference between the coarse-tune loop 104 output and the fine-tune loop 102 output (effectively giving the frequency produced by fine-tune loop 102 a negative sign). The auxillary counter bank 120e–120g has a fixed maximum count of 1000 and the programmed value is substracted from this maximum value. This eliminates the need for any code conversion, as the kilohertz and 10 kHz inputs may be used to directly program this auxiliary counter bank 120e–120g.

The output from divider 120 is applied to the input of a 3-state phase detector 122. The reference applied to the other input of phase detector 122 is taken from programmable Q divider 136, which includes three counters 136a, 136b, 136c in the preferred embodiment to provide a divide by Q factor of 1001 (divider 136 output $f_{ref2}$ is a nominal 1 kHz reference frequency). The error output of phase detector 122 is applied to the input of an integrating-type loop filter 170 including an active integrating stage 170a. Additional reference feed through elimination is provided by a twin-T notch filter 170b tuned to 1 kHz. The phase shift characteristics of loop filter 170 have little or no effect on the loop dynamics.

Figure 16C:
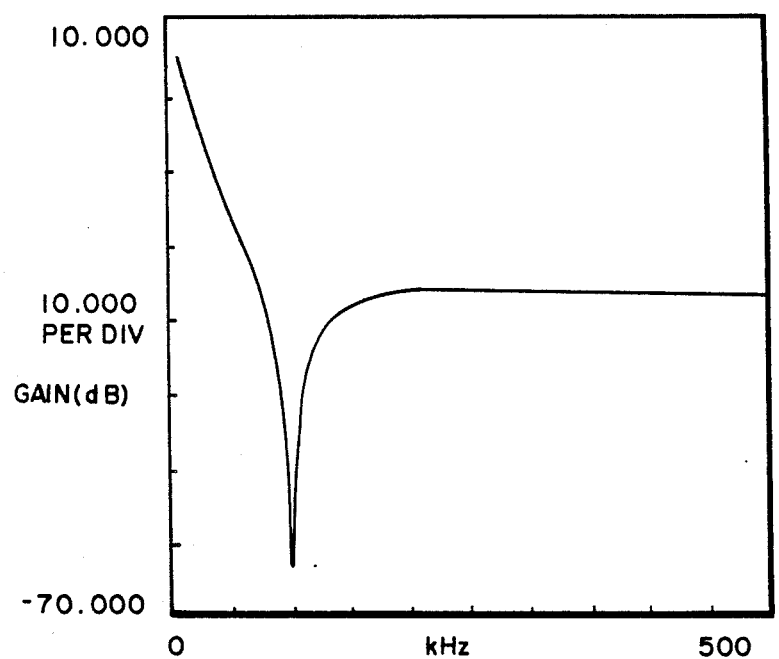
Figure 16D:
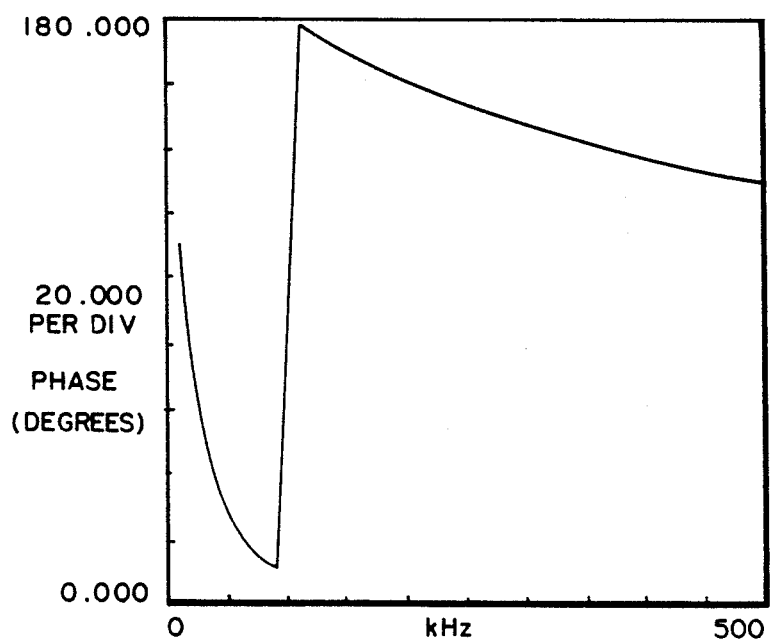

To verify the design of loop filter 170, the filter was simulated using a computer circuit analysis program. FIG. 16C shows the gain plot of filter 170. A relatively narrow notch appears at the loop reference frequency of 100 kHz while the basic response of the filter shows the classic integrator characteristic. The phase characteristics of loop filter 170 are shown in FIG. 16D. The effects of the notch are clearly visible at the reference frequency.

For the fine-tune loop 102 in the preferred embodiment, the constant of phase detector 122 was 0.796 radians/volt and the constant of VCO 118 was measured to be 2 MHz/volt. The natural loop frequency was calculated to be 204 radians/second, the loop damping factor was 0.323, the loop 3 dB bandwidth was determined to be 171 Hz, and the loop noise bandwidth was 104 Hz. The loop acquisition time was calculated to be an average of 3.6 seconds. The fact that the reference frequency $f_{ref2}$ of fine-tune loop 102 varies slightly has no bearing on these loop parameters, since these parameters are not a function of the reference frequency.

Figure 15E:
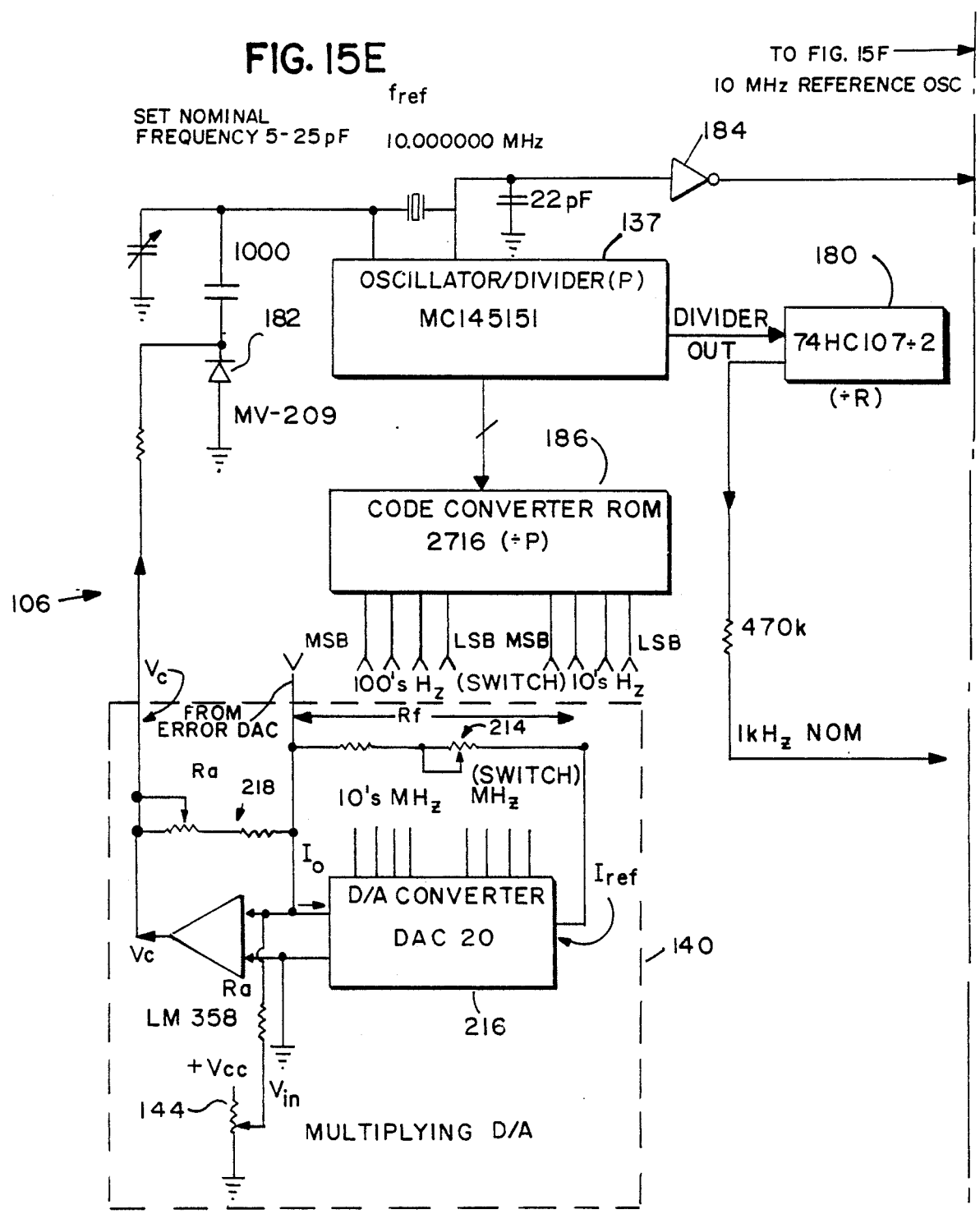
Figure 15F:
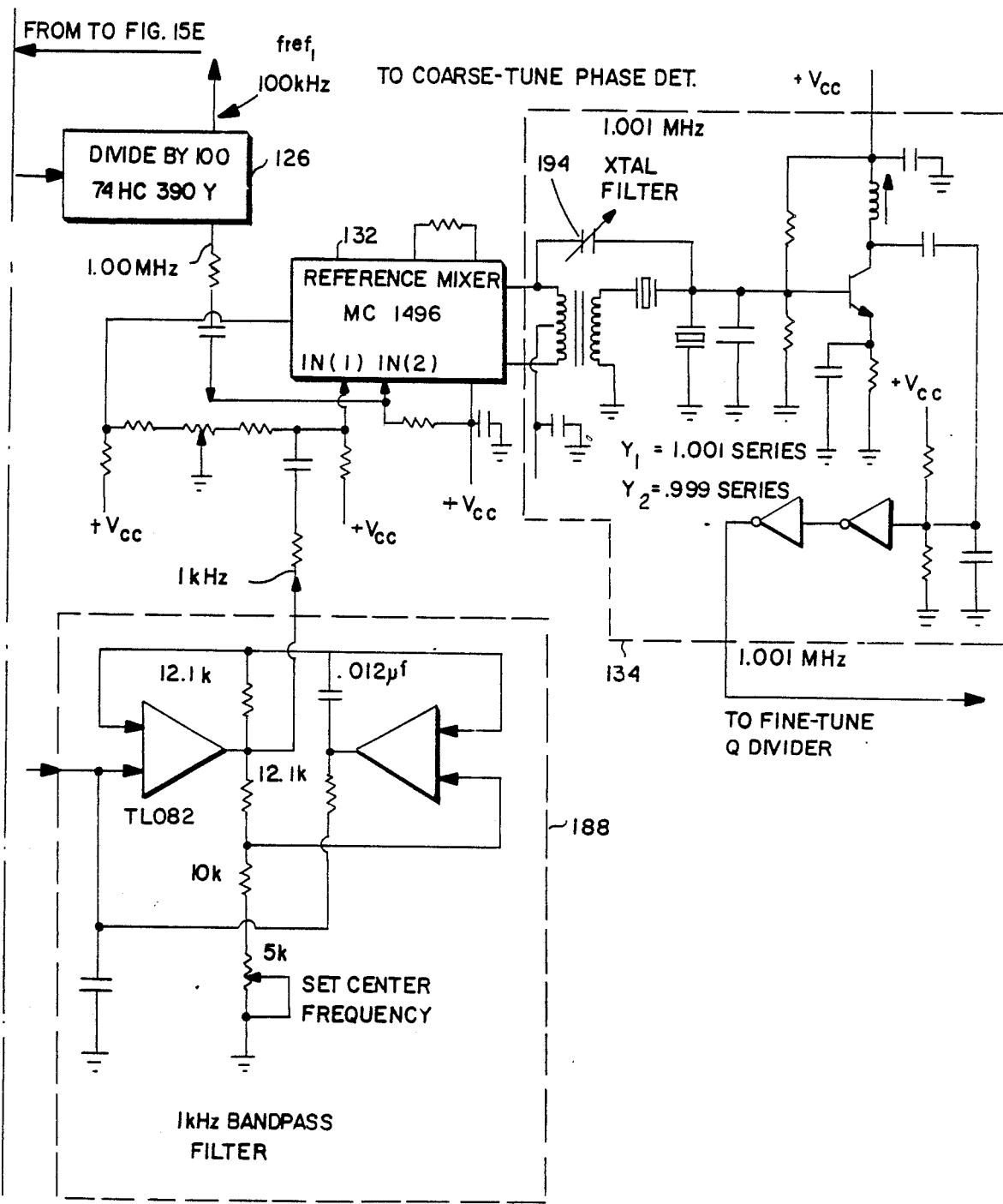
Figure 15:
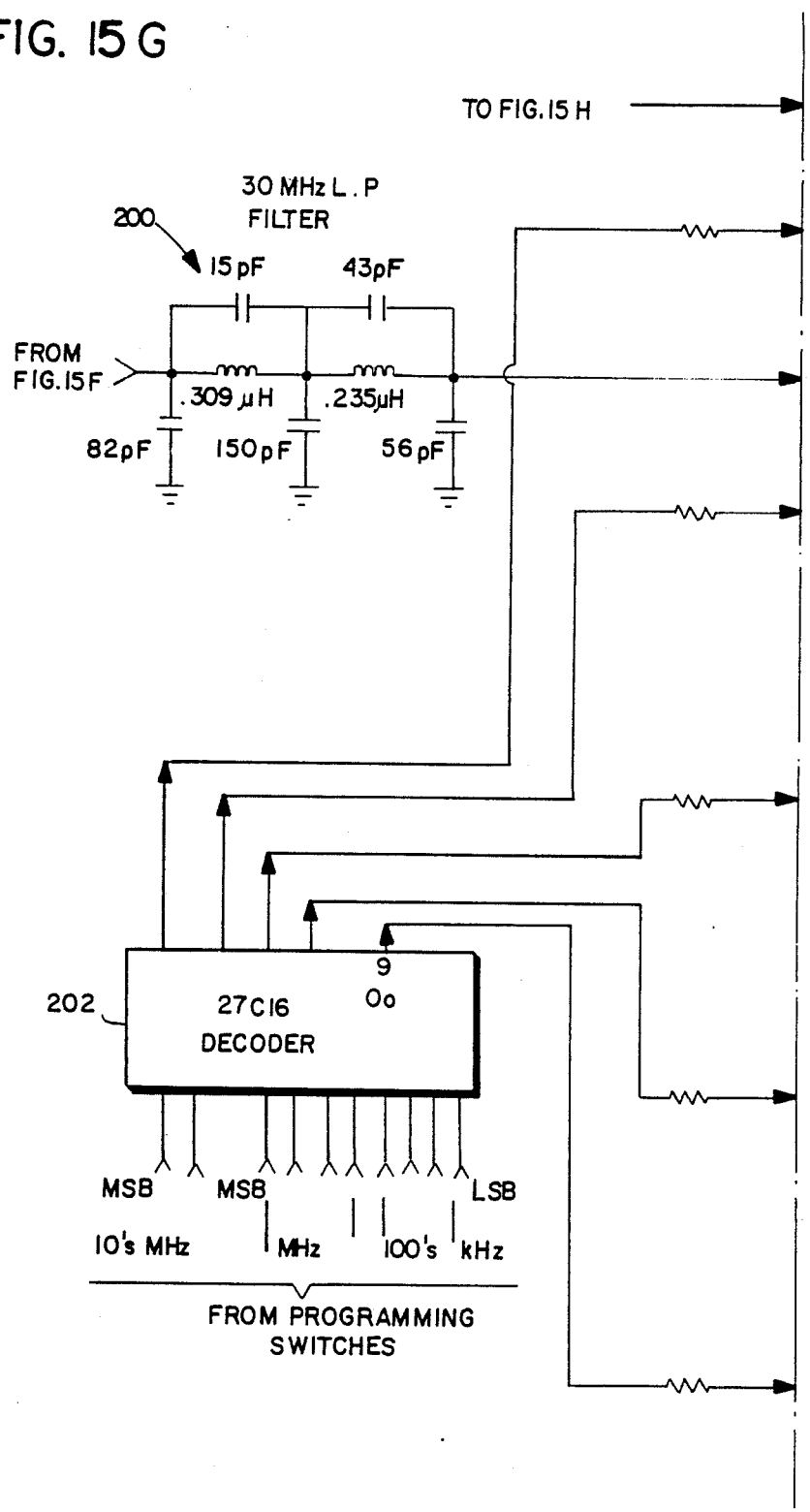
Figure 15H:
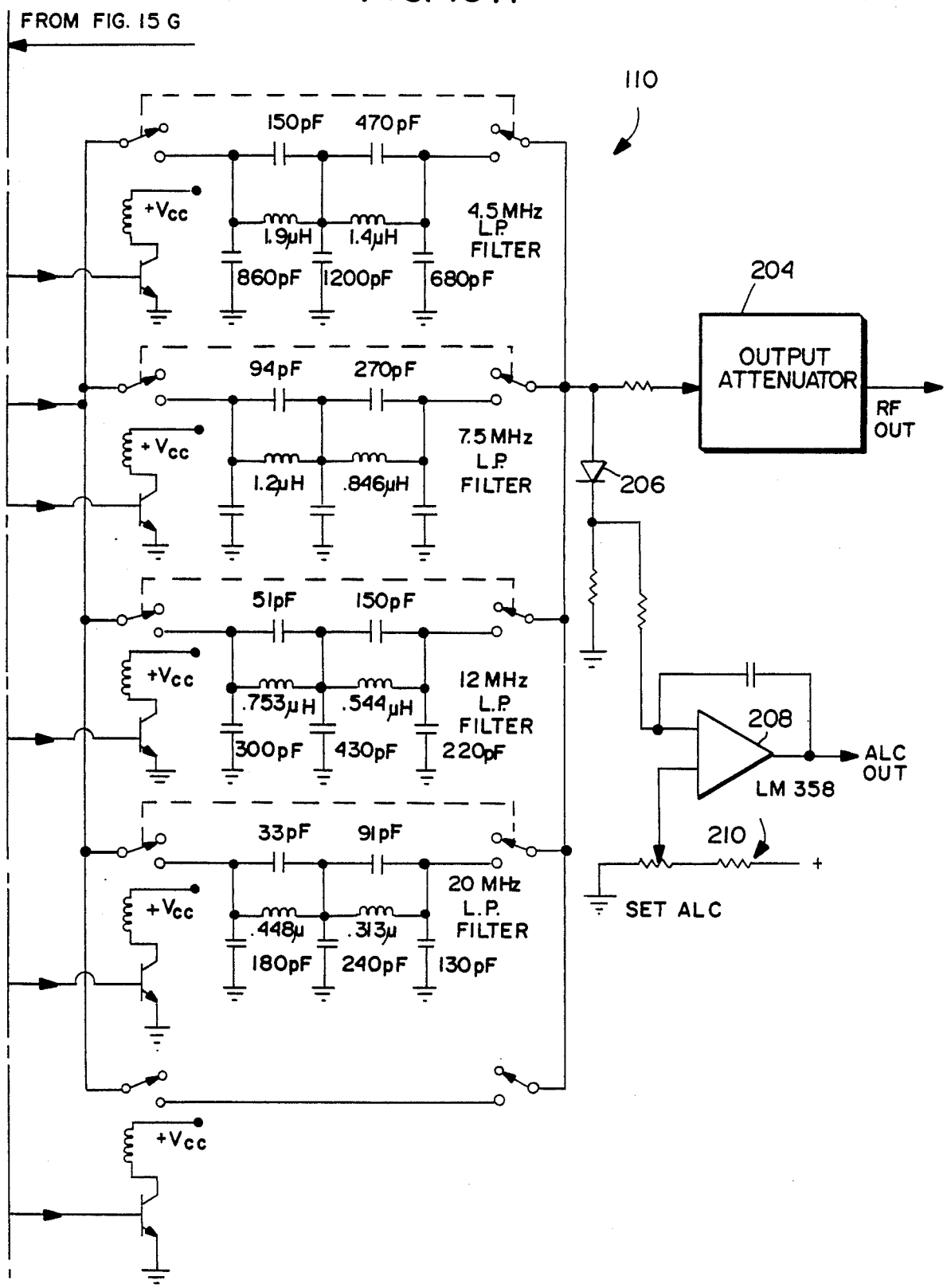

FIGS. 15E and 15F are together a detailed schematic diagram of direct frequency synthesizer 106. In the preferred implementation, the resolution of direct frequency synthesizer 106 was changed from 5 Hz to 10 Hz and then enhanced using the analog technique discussed in connection with FIGS. 12 and 13. To achieve this division, division ratios ranging from 5,000 to 5,099 are further divided by the factor of 2 using a toggle flip flop 180 to produce divisions extending from 10,000 to 10,198 in steps of two—which provides the 100 Hz and 10 Hz digits in 10 Hz steps. The well-defined spectrum of the perfect square wave available from flip flop 180 is helpful in assuring spectral purity of synthesizer 100.

A single-chip reference oscillator/divider 137 (Motorola MC145151 in the preferred embodiment) is used only for the programmable divider and reference oscillator (and not for its additional synthesizing features, the internal reference divider and phase detector portions of this integrated circuit being unused). The 10 MHz reference oscillator 137 uses the LSI synthesizer MC145151 on-chip oscillator, which is capable of providing small frequency variations required for the reference frequency correction technique discussed previously and for the implementation of the one-hertz decade. A varactor diode 182 provides an approximate plus or minus 10 PPM frequency variation of the reference frequency produced by oscillator 137.

The output of oscillator 137 drives a buffer 184, which in turn drives a divide-by-100 (Y) divider 126 (the 100 kHz reference frequency $f_{ref1}$ for the coarse-tune loop 104 and for the direct synthesizer mixer 132). Oscillator 137 also drives the internal programmable divider of the Motorola MC145151 integrated circuit, which implements the divide by P divider 130 in the preferred embodiment. The output of the internal divider is further divided by 2 with flip flop 180 to provide a perfect square wave (this further division by a factor of 2 is actually part of the value P). The output of flip flop divider 180 represents a division of 2(C+L), where C is a constant and L is a variable function of 10's Hz and 100's Hz switch inputs. In the preferred embodiment, the output of the 5 Hz, 10's Hz and 100's Hz divider is (K+M), where K=10,000 and M spans from 0 to 999. Thus, C is made equal to 5,000 and L spans from 0 to 99. Change in the value of L by 1 causes a 10 Hz frequency increment change.

The programming input to oscillator/divider 137 is in pure binary in the preferred embodiment, so a code conversion from the BCD programming switch input in the preferred embodiment to the program input of block 137 is required. The code conversion is performed by ROM 186 in the preferred embodiment, which changes the BCD from the switch inputs to pure binary and adds 136 so that the total division varies from 5,000 to 5,099 (corresponding to a total division from 10,000 to 10,198 after division by flip flop 180). A constant factor of 4,864 is applied to the programmable divider 137 input by connecting the 4096, 512 and 256 weight programming lines to logic level 1.

The 1 kHz signal produced at the output of flip flop divider 180 is filtered by a 1 kHz bandpass filter 188 in the preferred embodiment to provide a pure sine wave at this frequency (a simple resonant circuit using a gyrator is used in the preferred embodiment to perform this function). A perfect square wave has few spurious frequency components, and a simple filter is more than adequate to filter out undesired components. Such filtering is necessary to eliminate harmonics of the 1 kHz square wave—which would introduce undesired mixing products at the output of mixer 132 and places additional requirements on the filter 134 at the output of the mixer.

Mixer 132 mixes the 1.00 MHz reference signal produced by divider 126 with the approximately 1 kHz signal provided at the output of bandpass filter 188 to produce a difference signal of about 1.001 MHz. An active balanced mixer 132 is used to provide the frequency mixing. A balanced mixer is preferable to a single-ended mixer so that the 1 MHz mixer carrier can be balanced. This difference signal is filtered by crystal filter 134 to provide the 1.001 MHz reference signal. The reference signal is further divided by the factor Q by divider 136 (see FIG. 15C) to provide the 1 kHz reference $f_{ref2}$ for the fine-tune loop 102.

Crystal filter 134 must remove several outputs from the balanced mixer, including:
 (1) the image at 999 kHz+or −20 Hz,
 (2) the 1 MHz feed-through, and
 (3) harmonics of the 1 kHz mixer input signal (which would produce spurious sideband energy at 1.002, 1.003, 1.004 MHz, etc. as well as spurious energy at the image frequencies of 998 kHz, 997 kHz, etc.). The close-in spectral performance of synthesizer 100 is a function of how well these spurious signals can be eliminated. Preferably, all spurious signal components should be reduced to more than 60 dB below the desired output—and thus, a filter which has a 3 dB bandwidth of at least 20 Hz and a stopband more than 60 dB down at 1 kHz or more away is required. A crystal filter exhibits this type of performance. In the preferred embodiment, crystal filter 134 uses two quartz crystals. A series resonant crystal 190 passes the desired bandpass at 1.001 MHz, while a shunted series resonant crystal 192 at 0.999 MHz shunts the more difficult spurious signals, carrier feed-through and the image. The effects of the capacitance of crystal holders are cancelled by feeding an out-of-phase input from the balanced mixer via variable capacitor 194.

To verify the performance of crystal filter 134, a computer analysis was used to simulate the filter. Typical values of quartz crystal parameters for 1 MHz crystals were used for the simulation. These parameters are:
series resistance=250 ohms
shunt capacitance=4.7 pF
effective Q=65,000

Figure 16E:
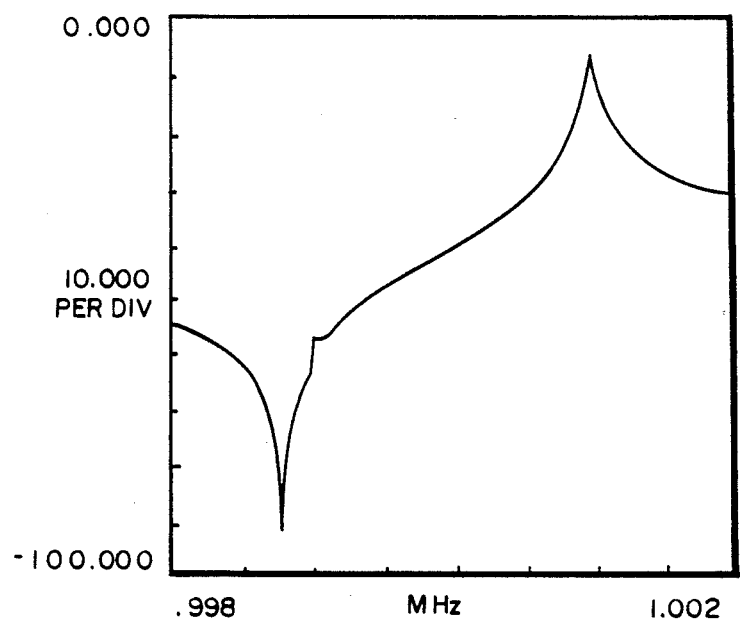
Figure 16F:
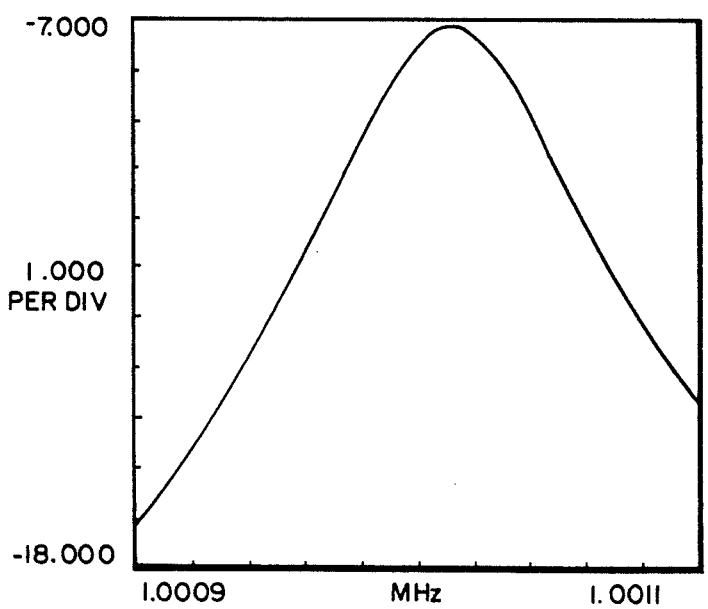

As shown in FIG. 16E, the value of capacitor 194 was optimized to obtain the optimum filter passband. The resulting passband is shown in FIGS. 16E and 16F As can be seen from FIG. 16F, the passband of the filter extends from 1.00100 MHz to 1.001050 MHz—which is ideal for the desired passband. Although the variation of 1.001 MHz signal is only 20 Hz, the 1500 Hz passband allows sufficient leeway for crystal aging and temperature drift. Stopband at the image of 999 kHz is about 90 dB down while the filter has a 40 dB insertion loss at the carrier frequency of 1.000 MHz. The response of the practical filter 134 shown in FIG. 15E may not quite match the ideal characteristics shown in FIGS. 16E and 16F, but the basic filter shape shown in FIG. 16F should be attainable with an acceptable passband using this type of crystal filter configuration. The output of crystal filter 134 (nominally 1.001 MHz) is applied to the input of fine-tune loop Q divider 136 (shown in FIG. 15C), which divides by a factor of 1001 in the preferred embodiment. Because of this divide-by-1001 factor in the preferred embodiment, the maximum frequency variation at the input of phase detector 122 due to shifting of reference oscillator 137 is 0.0194 Hz. Any phase jitter caused by variations of the threshold voltage of Q divider 136 may cause phase jitter in the output of synthesizer 100. Therefore, the output of reference mixer 132 is amplified to more than 20 volts peak-to-peak in the preferred embodiment, and this signal is then limited for driving Q divider 136. In this way, a positive peak is always guaranteed to be above the threshold voltage of the Q divider 136.

Figure 16G:
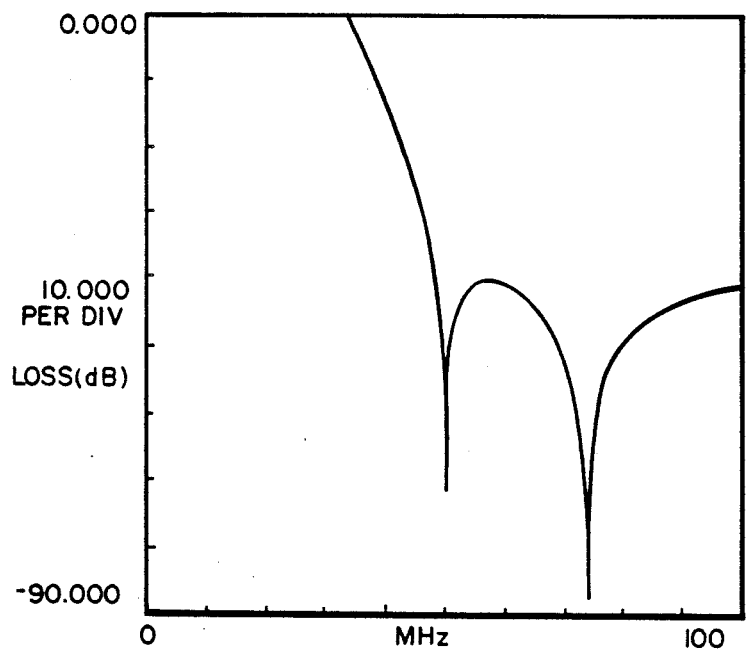

Referring once again to FIGS. 15A and 15B, the output of coarse-tune VCO 112 is applied to one input of mixer 108 (after being amplified by buffer amplifier 160). The output of fine-tune loop VCO 118 is applied to the other input of mixer 108 after being amplified by a buffer amplifier 196. Mixer 108 produces an output which is amplified by a buffer 198 and is then applied to lowpass filter 200 shown in FIG. 15G. Lowpass filter 200 reduces the level of harmonics present in the synthesizer output. 30 MHz lowpass filter 200 is connected at all times, and one of the frequency filters included in arrangement 110 is connected dependent upon the selected output frequency. FIG. 16G shows the passband of the 30 MHz filter. This filter has a passband ripple of about 0.5 dB and provides a lowest-frequency second harmonic rejection of 30 dB.

The output of lowpass filter 200 is applied to band-switched lowpass filter arrangement 110. The various filters must remove all harmonics from the output signal including the second harmonic. In the preferred embodiment, the ratio of frequencies passed by a single filter within arrangement 110 is on the order of 1.6, the actual ratio being adjusted slightly to ease implementation. The following five frequency bands were selected for band-switched filter arrangement 110: 3.0 MHz–4.5 MHz (ratio=1.5); 4.5 MHz–7.5 MHz (ratio=1.7); 7.5 MHz—12.0 MHz (ratio=1.6); 12.0 MHz–20.0 MHz (ratio=1.7); and 20.0 MHz–30.0 MHz (ratio=1.5). Elliptical filters are used in the preferred embodiment to insure that the second harmonic is reduced at least 25 dB below the output of the mixer. The worst-case second harmonic having a level of only 15 dB below the carrier level input to the filter will generate a worst-case harmonic content of 40 dB below the desired signal for synthesizer 100 (which is very acceptable for a general-purpose signal generator).

Electrical mechanical relays controlled by the output of a decoder 202 are used to automatically select one of the lowpass filters in the preferred embodiment. Other switching elements (e.g. PIN or junction diodes) could be used rather than relays, as those skilled in the art will readily understand. An output attenuator 204 permits a desired output level to be obtained from synthesizer 100.

ALC amplifier 208 compares the filter 110 output level rectified by diode 206 with a reference level generated by an adjustable level source 210. The output of ALC amplifier 208 is connected to the input of mixer 108 (see FIG. 15B)—and in particular, controls the amount of attenuation introduced by a PIN diode attenuator 212. Attenuation is used at the input of mixer 108 rather than at output attenuator 204 because few PIN diodes are effective as attenuators at frequencies below 10 MHz (and in the preferred embodiment, the inputs of mixer 108 have a higher frequency than the output of the mixer). Placing the ALC rectifier 206 after lowpass filter arrangement 110 reduces any variation in signal amplitude due to ripple produced by the characteristics of the filters. The passbands of the filters in arrangement 110 have been adjusted for a ripple of 0.5 dB maximum so that ALC amplifier 208 is not required to have an extremely wide dynamic range.

The frequency correction scheme discussed previously has been included in the embodiment of frequency synthesizer 100 shown in FIGS. 15A–15H Referring more particularly once again to FIG. 15E, multiplying D/A converter 140 (including an integrated circuit D/A converter 216 in the preferred embodiment) is programmed in the preferred embodiment by the 10's MHz and 1's MHz switches (only the two most significant digits are used for correction in the preferred embodiment). The D/A converter 216 is connected in a feed-back loop to provide a division function required by the correction technique. Equation 27 set forth previously describes the relationship between change in output frequency $f_{out}$ synthesizer 100 with respect to the change in the error correction signal applied by multiplying D/A converter 140 to the input of reference oscillator 137. D/A converter 140 exhibits the following relationship:

$$X = INT(f(100 \text{ kHz})) + 510 \tag{28}$$

where Int(f(100 kHz)) is the integer function (i.e., the largest integer less than the selected frequency in hundreds of kilohertz). The current, $I_o$, generated at the output of multiplying D/A converter 140 relates to the correction voltage $V_c$ produced by the D/A converter as follows $$I_0 = [INT(f(\text{MHz})) + 50)]\frac{V_c}{100\,R_f} \quad (29)$$

where $R_f$ is the value of a resister 214 connected in feedback arrangement between the output of $I_0$ and the input $I_{ref}$ of D/A converter integrated circuit 216. Integrated circuit 216 is a 2-digit binary coded decimal converter with its input scaled by a factor of 100 in the preferred embodiment. The value of $R_f$ and the value of a further resistor network 218 $R_a$ (which feeds some of the output voltage $V_c$ back into the input of D/A converter 216) are carefully selected to provide the relationship of Equation 29 and also to insure that the change in output frequency $f_{out}$ of synthesizer 100 is a constant linear function of $V_{in}$ (the reference voltage produced by vernier potentiometer 144). In the preferred embodiment, resistor 218 ($R_a$) has a nominal value of 5.5 kilohms, and resistor 214 ($R_{ref}$) has a nominal value of 4.4 kilohms. The value of K in Equation 27 (actually a parameter of reference oscillator 137) is 100 Hz/volts in the preferred embodiment and is linear to about 10%. Based upon this characteristic, the required current $I_o$ to be produced by D/A requires an additional 0.227 mA to provide the least significant digit of resolution of synthesizer 100. This is provided by a simple potentiometer 144 in the preferred embodiment (an additional D/A converter programmed from a front panel switch could be used to provide the appearance of a completely digital synthesizer 100 if desired).

One important performance characteristic of synthesizer 100 is its frequency accuracy.

Figure 17A:
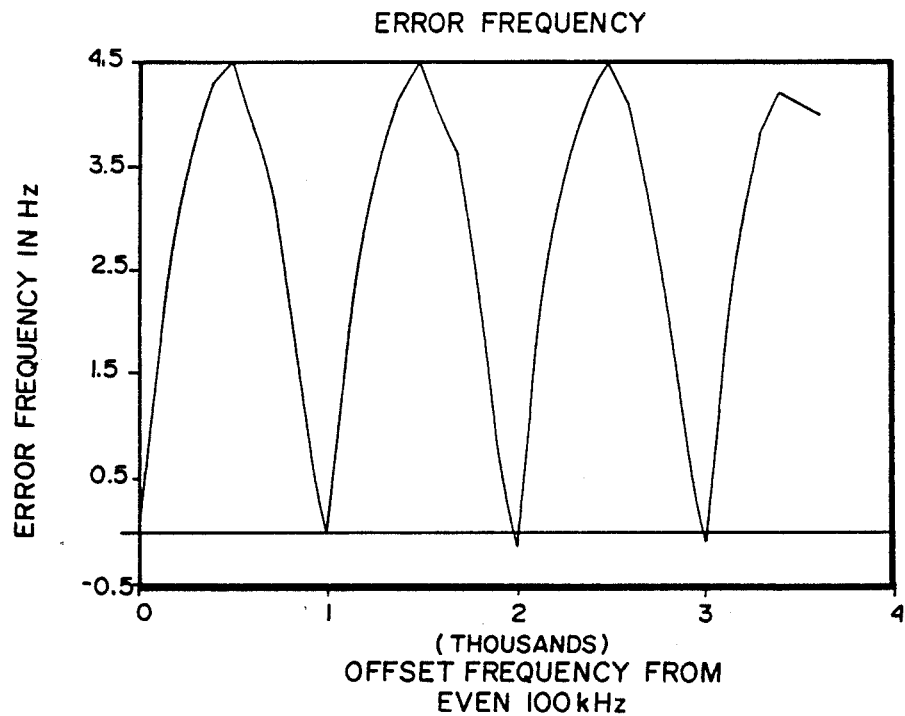
FIGS. 17A-17C are graphical illustrations of measured frequency errors produced by the FIG. 12 circuit.
Figure 17B:
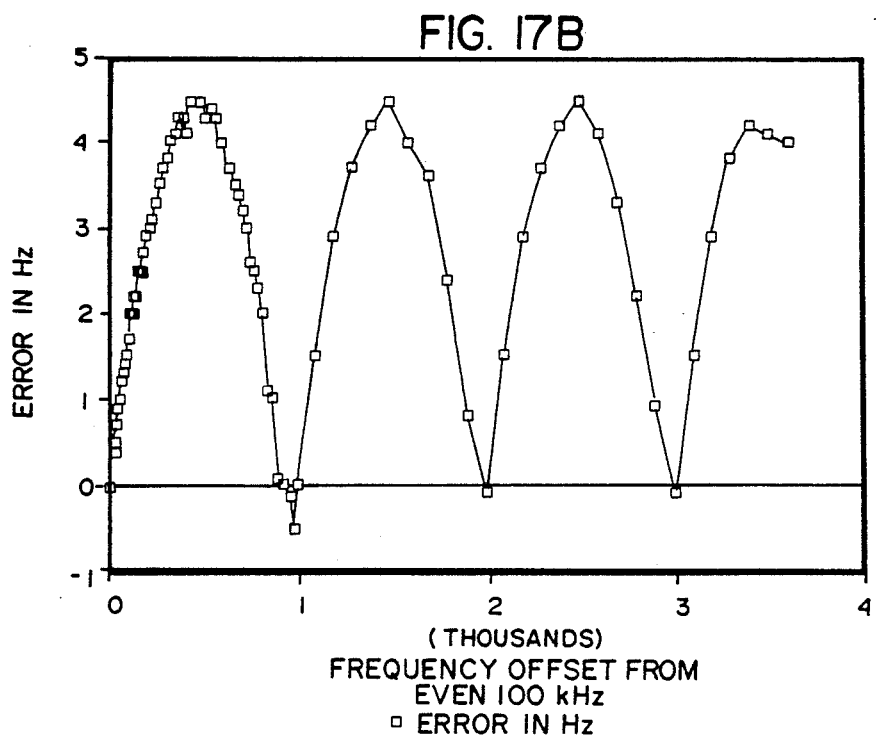
Figure 17C:
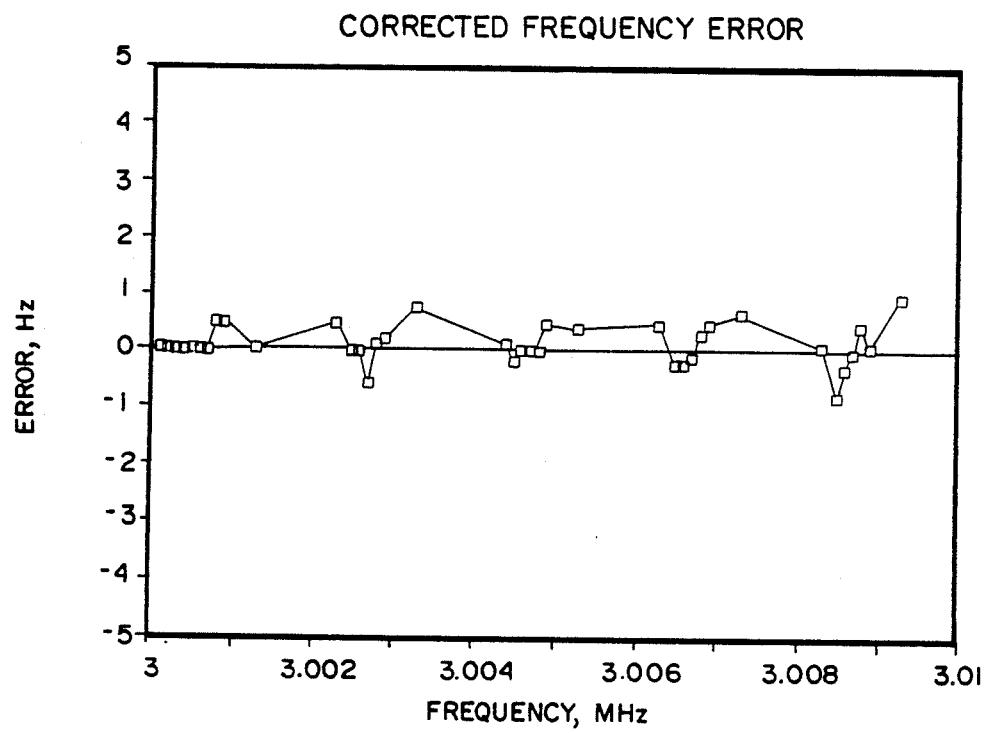

FIGS. 17A-17C show the results of frequency accuracy tests performed on the exemplary embodiment shown in FIGS. 15A-15H. The tests were performed using a frequency counter connected to the output of synthesizer 100. The 10 MHz precision reference oscillator 137 was set to exactly 10.000000 MHz (plus or minus 1 Hz) and the error correction was first disabled. With error correction disabled, the output frequency was measured to verify the magnitude of errors. Table II below shows some of the results of this testing. FIGS. 17A and 17B plots of the actual error in frequency of the output of synthesizer 100 for output frequencies offset from even 100 kHz. These plots of actual error frequency are almost identical to the predicted error frequency shown in FIGS. 11A and 11B.

TABLE II

| Dialed Frequency kHz | Actual Frequency kHz | Error Hz |
|---|---|---|
| 100.000 | 100.0000 | 0.0 |
| 100.010 | 100.0100 | 0.0 |
| 100.020 | 100.0204 | 0.4 |
| 100.030 | 100.0305 | 0.5 |
| 100.040 | 100.0407 | 0.7 |
| 100.050 | 100.0509 | 0.9 |
| 100.060 | 100.0610 | 1.0 |
| 100.070 | 100.0712 | 1.2 |
| 100.080 | 100.0813 | 1.3 |
| 100.090 | 100.0914 | 1.4 |
| 100.100 | 100.1015 | 1.5 |
| 100.110 | 100.1117 | 1.7 |
| 100.120 | 100.1220 | 2.0 |
| 100.130 | 100.1320 | 2.0 |
| 100.140 | 100.1422 | 2.2 |
| 100.150 | 100.1522 | 2.2 |
| 100.160 | 100.1625 | 2.5 |
| 100.170 | 100.1725 | 2.5 |
| 100.180 | 100.1825 | 2.5 |
| 100.190 | 100.1927 | 2.7 |
| 100.200 | 100.2029 | 2.9 |

TABLE II-continued

| Dialed Frequency kHz | Actual Frequency kHz | Error Hz |
|---|---|---|
| 100.220 | 100.2230 | 3.0 |
| 100.240 | 100.2431 | 3.1 |
| 100.260 | 100.2633 | 3.3 |
| 100.280 | 100.2835 | 3.5 |
| 100.300 | 100.3037 | 3.7 |
| 100.320 | 100.3238 | 3.8 |
| 100.340 | 100.3440 | 4.0 |
| 100.360 | 100.3641 | 4.1 |
| 100.380 | 100.2843 | 4.3 |
| 100.400 | 100.4043 | 4.3 |
| 100.420 | 100.4241 | 4.1 |
| 100.440 | 100.4244 | 4.4 |
| 100.460 | 100.4645 | 4.5 |
| 100.480 | 100.4845 | 4.5 |
| 100.500 | 100.5045 | 4.5 |
| 100.540 | 100.5444 | 4.4 |
| 100.560 | 100.5644 | 4.4 |
| 100.580 | 100.5843 | 4.3 |
| 100.600 | 100.6040 | 4.0 |
| 100.620 | 100.6240 | 4.0 |
| 100.640 | 100.6437 | 3.7 |
| 100.660 | 100.6637 | 3.7 |
| 100.680 | 100.6835 | 3.5 |
| 100.700 | 100.7034 | 3.4 |
| 100.720 | 100.7232 | 3.2 |
| 100.740 | 100.7430 | 3.0 |
| 100.760 | 100.7626 | 2.6 |
| 100.780 | 100.7825 | 2.5 |
| 100.800 | 100.8023 | 2.3 |
| 100.820 | 100.8220 | 2.0 |
| 100.840 | 100.8417 | 1.7 |
| 100.860 | 100.8610 | 1.0 |
| 100.880 | 100.8810 | 1.0 |
| 100.900 | 100.9008 | 0.9 |
| 100.920 | 100.9205 | 0.5 |
| 100.940 | 100.9402 | 0.2 |
| 100.960 | 100.9599 | −0.1 |
| 100.980 | 100.9795 | −0.5 |
| 101.000 | 101.0000 | 0.0 |
| 101.100 | 101.1015 | 1.5 |
| 101.200 | 101.2029 | 2.9 |
| 101.300 | 101.3037 | 3.7 |
| 101.400 | 101.4042 | 4.2 |
| 101.500 | 101.5045 | 4.5 |
| 101.600 | 101.6040 | 4.0 |
| 101.700 | 101.7036 | 3.6 |
| 101.800 | 101.8024 | 2.4 |
| 101.900 | 101.9008 | 0.8 |
| 102.000 | 101.9999 | −0.1 |
| 102.100 | 102.1015 | 1.5 |
| 102.200 | 102.2029 | 2.9 |
| 102.300 | 102.3037 | 3.7 |
| 102.400 | 102.4042 | 4.2 |
| 102.500 | 102.5041 | 4.1 |
| 102.600 | 102.6041 | 4.1 |
| 102.700 | 102.7033 | 3.1 |
| 102.800 | 102.8022 | 2.2 |
| 102.900 | 102.9009 | 0.9 |
| 103.000 | 102.9999 | −0.1 |
| 103.100 | 103.1015 | 1.5 |
| 103.200 | 103.2029 | 2.9 |
| 103.300 | 103.3038 | 3.8 |
| 103.400 | 103.4042 | 4.2 |
| 103.500 | 104.5041 | 4.1 |

To verify the operation of the 10's Hz, 100's Hz, kHz and 10's kHz digits, each digit was operated through its entire range. Some of the results of this test are tabulated in TABLE III below:

TABLE III

| Dialed Frequency kHz | Actual Frequency kHz | Error Hz |
|---|---|---|
| 100.00 | 100.000 | 0.0 |
| 100.01 | 100.0100 | 0.0 |
| 100.02 | 100.0204 | 0.4 |
| 100.03 | 100.0305 | 0.5 |

TABLE III-continued

| Dialed Frequency kHz | Actual Frequency kHz | Error Hz |
| --- | --- | --- |
| 100.04 | 100.0407 | 0.4 |
| 100.05 | 100.0509 | 0.9 |
| 100.06 | 100.0610 | 1.0 |
| 100.07 | 100.0712 | 1.2 |
| 100.08 | 100.0813 | 1.3 |
| 100.09 | 100.0914 | 1.4 |
| 100.10 | 100.1015 | 1.5 |
| 100.20 | 100.2029 | 2.9 |
| 100.30 | 100.3037 | 3.7 |
| 100.40 | 100.4043 | 4.3 |
| 100.50 | 100.5045 | 4.5 |
| 100.60 | 100.6040 | 4.0 |
| 100.70 | 100.7034 | 3.4 |
| 100.80 | 100.8023 | 2.3 |
| 100.90 | 100.9008 | 0.8 |
| 101.00 | 101.0000 | 0.0 |
| 102.00 | 101.9999 | −.9 |
| 103.00 | 102.9999 | −.9 |

The error correction was then re-enabled, and the same frequencies dialed in to produce the plot of FIG. 17B were programmed once again. The plot shown in FIG. 17C resulted. As can be seen by comparing FIG. 17B and 17C, the magnitude of the output frequency error is reduced by a factor of more than 5 using the error correction technique described previously.

Figure 18:
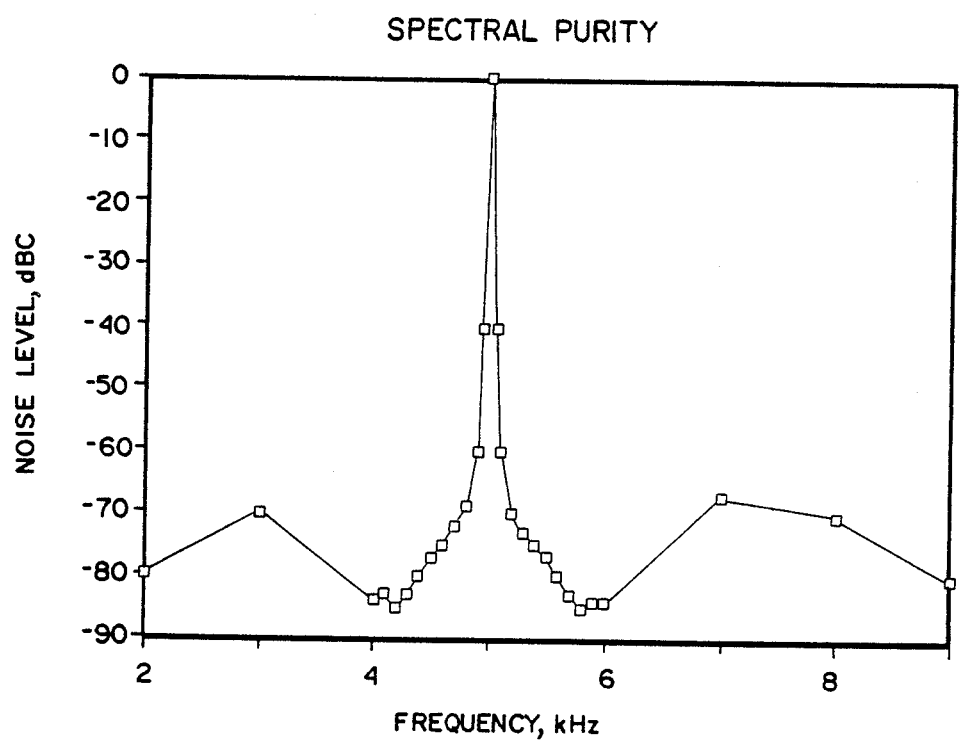
FIGS. 18-19B are graphical illustrations of measured phase noise and spectrum outputs produced by the FIG. 12 circuit.

The spectral purity of the preferred embodiment of synthesizer 100 was also measured—first using an audio-frequency wave analyzer to measure the sideband and noise level of the output, and then with a spectrum analyzer. An output frequency of 5 kHz was selected for the spectral purity measurement. FIG. 18 is a plot of the actual spectral output of a low frequency signal produced by synthesizer 100. While the plot shows some sideband energy at 60 Hz due to power supply ripple and sidebands at 2 kHz and 3 kHz due to the fine-tune loop reference frequency, the fundamental 1 kHz reference sideband is greatly attenuated due to the characteristics of fine-tune loop filter 170.

Figure 19A:
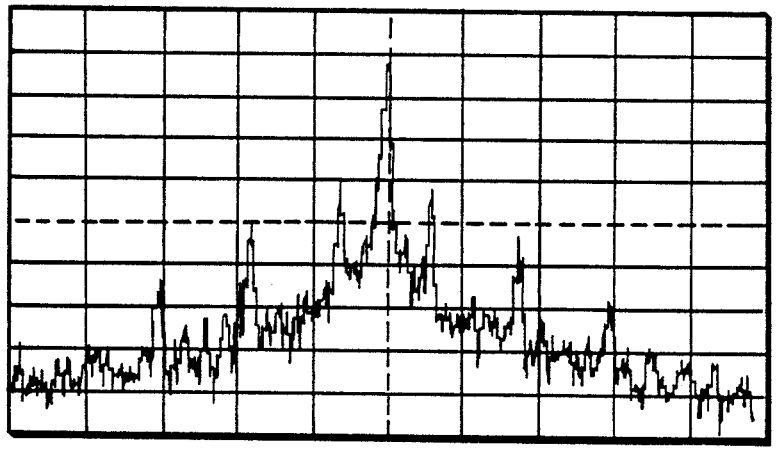
Figure 19B:
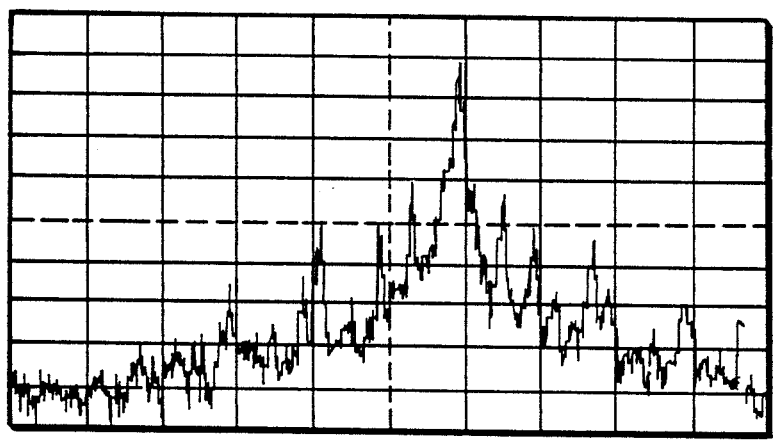

A spectrum analyzer was then used to measure the spectral purity of the output of frequency synthesizer 100 at a much higher frequency (1.000460 MHz). FIG. 19A shows the spectrum output for this output frequency. The phase noise level is more than 60 dB down at 100 Hz from the carrier (which is contained in the 3 Hz bandwidth). The output frequency of synthesizer 100 was then raised 100 Hz to provide the resulting spectrum output shown in FIG. 19B. There is a pair of sidebands at approximately 100 Hz from the carrier down only 40 dB which was traced to radiation from the digital circuits of synthesizer 100. Thus, as mentioned previously, shielding and decoupling of the various circuits is very important to the spectral purity of the synthesizer 100 output.

Lockup time is a rather difficult parameter to measure. Attempts were made to measure this parameter, but no definitive results were obtained. It was clear, however, that the lockup time is sufficiently short to cause no real difficulties. The preferred embodiment shown in FIGS. 15A-15H exhibited a lockup time of less than one second for frequency step changes of 100 kHz, 1 MHz and 10 MHz (representing changes in the frequency of the coarse-tune loop 104). As expected, changes in the fine-tune loop 102 output frequency caused lockup time of a greater duration—due to the lower bandwidth and operating frequency of the fine-tune loop. The preferred embodiment exhibited a lockup time of on the order of 2 seconds for a 10 Hz frequency step, 3 seconds for a 100 Hz frequency step, 4 seconds for a 1 kHz step, and 6 seconds for a 10 kHz step.

FIG. 20 is a schematic block diagram of a further exemplary preferred embodiment of the present invention using a microprocessor-based controller including a microprocessor 250 which controls the direct frequency generating components of direct synthesizer 106a and also directly controls LSI PLL synthesizer chips 252, 254 included in fine-tune loop 102 and coarse-tune loop 104, respectively. Synthesizer chips 252, 254 used in the preferred embodiment are Motorola MC145159 advanced LSI frequency synthesizers which provide dual modulus prescaling allowing direct synthesis well into the VHF/UHF region. These chips also include internal programmable dividers and reference dividers which can be programmed by microprocessor 250 for a large subset of values. Motorola publishes standard data sheets on its MC145159 serial input PLL frequency synthesizer with analog phase detector, these published specifications being incorporated herein by reference. A second Motorola LSI synthesizer number MC145157 is used in the preferred embodiment as reference oscillator 256. This integrated circuit is a single modulus synthesizer and includes two 14-bit programmable dividers one of which is intended to be used for the division of a crystal oscillator frequency to provide a reference frequency and the other being the programmable divider for the internal PLL. Synthesizers 252, 254, 256 are all controlled by microprocessor 250 via a serial databus 258 using standard serial data formats published by Motorola.

As will be understood by comparing FIG. 20 with FIG. 12, the general architectures of the microprocessor-controlled and the discrete logic controlled preferred embodiments are very similar. One change in the microprocessor-based design is that the division ratio of the dual modulus prescaler 120a has been changed. There are no significant advantages to using 10/11 dividers or a divide by J+1 divider in the microprocessor design since changing division factors of the main counters within synthesizers 252, 254, 256 may be effected by merely reprogramming microprocessor 250. Coarse-tune loop 104 in this embodiment, as in the other embodiment, is a simple phase locked loop using a low-power 10/11 divider 114d. LSI synthesizer chip 254 operates in the 5.4 MHz to 8 MHz range. The main divider is programmed from 54 to 79—which corresponds to the megahertz and 10's MHz programming from 3 to 29 MHz. The 100 kHz programming sets the auxiliary counter within synthesizer 254 from 0 to 9. Fine-tune loop 102 uses a low power dual modulus 80/81 prescaler 120a. The main counter of synthesizer 252 is programmed for only two values: 636 or 637. The auxiliary counter of synthesizer chip 252 is programmed from 0 to 80. These values provide the necessary N division from 51,000 to 50,901.

Reference divisor within synthesizer 252 is programmed for a fixed Q division of 1001 to divide the nominal 1.001 MHz reference frequency to 1 kHz. In the embodiment shown in FIG. 20, error correction is performed by dynamically solving the error equations and generating an appropriate control voltage (via D/A converter 140) to control the voltage controlled crystal reference oscillator implemented by synthesizer 256. In particular, Equation 23 is solved for $f_{ref}$, set equal to Equation 22, and substituted into Equation 26 to provide the following error correction equation:

$$V_c = \frac{F}{K\left[\dfrac{X}{10^2} - \dfrac{N}{1001}\left(\dfrac{1}{10} + \dfrac{1}{10^4 + M}\right)\right]} - \frac{10^7}{K} \quad (30)$$

which shows that the correction voltage $V_c$ can be generated from either direct user-specified desired frequency information used to program inputs to synthesizer 100 or from decoded/encoded system parameters K, M and N used to program specific frequency divisors. The 1 Hz decade may also be provided from Equation 25, which, when substituted into Equation 30, yields the following error correction calculation to be performed by microprocessor 250:

$$V_c = \frac{F}{K\left[\dfrac{X}{10^2} - \dfrac{N}{1001}\left(\dfrac{1}{10} + \dfrac{1}{10^4 + M}\right)\right]} + \quad (31)$$

$$\frac{100Z}{K(X - 305)} - 10^7/K$$

where Z is the hertz digit.

The error correction is made in the preferred embodiment to within 0.1 Hz while the hertz decade requires a 10 Hz offset with 1 Hz resolution within about the same 0.1 Hz accuracy. This requires 100 discrete frequency steps with an ultimate resolution of 0.1 Hz. The error correction part of the equation requires a 4.5 Hz frequency offset in the preferred embodiment with the same 0.1 Hz resolution. As explained previously, the hertz decade requires a positive frequency offset while the error correction requires a negative frequency offset. Therefore, the total reference frequency excursion is $-4.5$ Hz to $+9$ Hz for a total of about 13.5 Hz and 0.1 steps—which can easily be encoded in 8 bits. Thus, D/A converter 140 should preferably be an 8-bit converter controlled by an 8-bit output of microprocessor 250.

A somewhat more sophisticated error correction technique may be implemented by microprocessor 250 if desired, in order to eliminate or supplement D/A converter and the voltage controlled aspect of reference oscillator 256. As discussed in great detail previously, the approximations implemented by the preferred embodiment of the present invention produce an inherent frequency output error which can be corrected but never eliminated. However, as already discussed, it is possible to minimize the frequency output error through selection of the dividing factors of the various counters. It is possible for microprocessor 250 to dynamically select the dividing factors N, Q, X, Y, P and R for a particular desired output frequency in order to minimize output error. That is, more than one different combination of factors N, P, Q, R, X and Y can be programmed to produce the same approximate output frequency $f_{out}$—but different combinations will result in different output error. Microprocessor 250 is capable of dynamically calculating, for a given user-inputted desired output frequency, the frequency output error resulting from different combinations of these variables. Microprocessor 250 may then select a combination providing a minimal or acceptable output error and program all of these dividing factors by communicating digital signals over serial databus 258 to synthesizer 252, 254, 256. In some applications, this error minimization technique may provide sufficiently low output error so that D/A converter 140 and the voltage controlled correction of reference oscillator 256 can be eliminated. Alternatively, both error correction techniques can be used simultaneously to provide virtually any desired error resolution.

Figure 21:
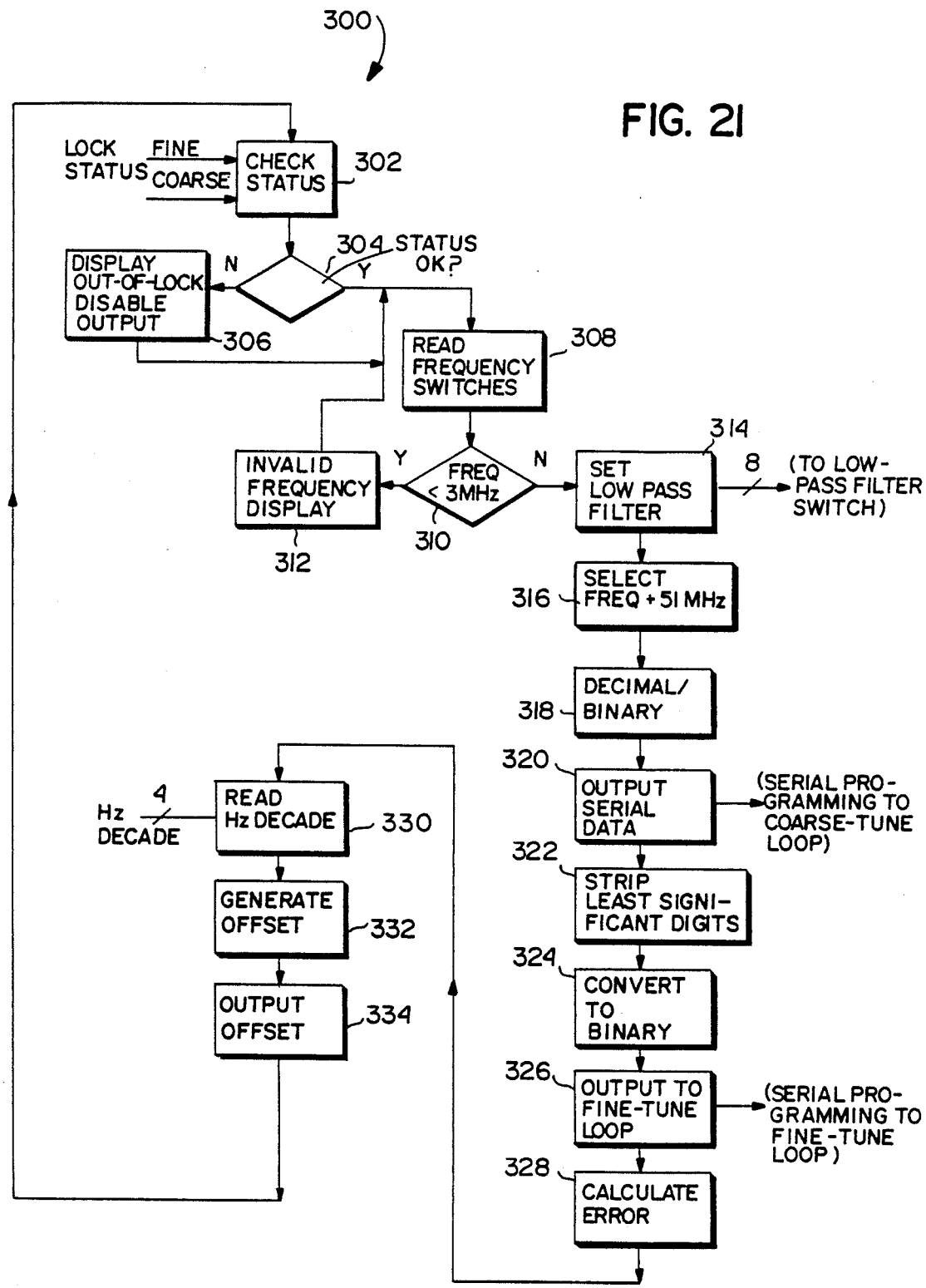
FIG. 21 is a schematic flow chart of exemplary program control steps performed by the microprocessor shown in FIG. 20.

FIG. 21 is a flow chart of exemplary programmed control steps performed by microprocessor 250 in the preferred embodiment. After power up, self-testing, and initialization of the various fixed counters divisors of synthesizers 252, 254, 256, microprocessor 250 begins executing a main loop 300 in which it first determines whether the coarse-tune and fine-tune loops 102, 104 are locked (e.g., by reading status indicating parameters from synthesizers 252, 254) (block 302). If either loop is not locked and a sufficient time has passed to insure that the maximum lockup time of fine-tune loop 102 has also elapsed (as determined by decision block 304), microprocessor 250 determines that the user has selected an out-of-range frequency, displays an error message, and disables synthesizer output 100 (block 306). Microprocessor 250 then reads the user-programmable control switches (which in the preferred embodiment may be any sort of user interface, such as a keyboard, thumb wheel switches or rotary multi-position switches) (block 308) and determines whether the dial-in frequency is within the range of frequency synthesizer 100 (decision block 310). If the dial-in frequency is not within this range, an error message may be displayed (block 312) and the microprocessor waits for the user to input a correct frequency (block 308).

If the dial-in frequency is within the proper range, microprocessor 250 sets the various parameters of synthesizers 252, 254, 256 to correspond to the dialed-in frequency. In particular, microprocessor 250 first selects the filter within output filter arrangement 110 which corresponds to the dialed-in frequency (block 314), and then calculates the output frequency of coarse-tune loop 104 by adding the program frequency and 51 MHz (block 316) (this resulting value may be dynamically calculated using the equations discussed previously, or obtained from a lookup table stored in memory), converting this sum to binary (block 318), and communicating the resulting value in serial format over serial databus 258 to synthesizer 254 (block 256). Microprocessor 250 then strips the least significant digits from the value calculated by block 316 (block 322), converts the resulting new value to binary (block 324) and communicates this binary value in serial data format via serial databus 258 to fine-tune loop synthesizer 252 (block 326). Microprocessor 250 then calculates the error which will result from programming of synthesizers 252, 254 using Equation 30 (block 328), reads the hertz programming switch input from the user controls (block 330) and adds the factor given by Equation 28 into the error voltage (as is shown in Equation 31) (block 330). Microprocessor 250 then generates an 8-bit value representing the correction voltage $V_c$ and applies this value to D/A converter 140 (blocks 332, 334).

Figure 14:
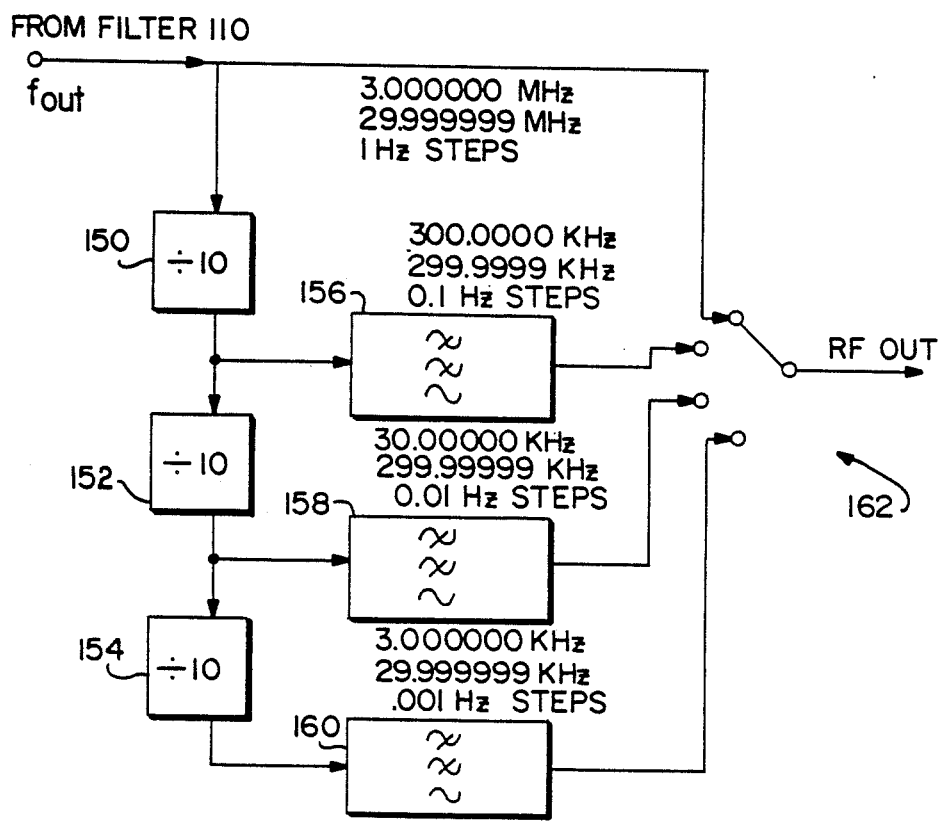
FIG. 14 is a detailed schematic diagram of an exemplary bandswitching and dividing output network shown in FIG. 12.
Figure 22:
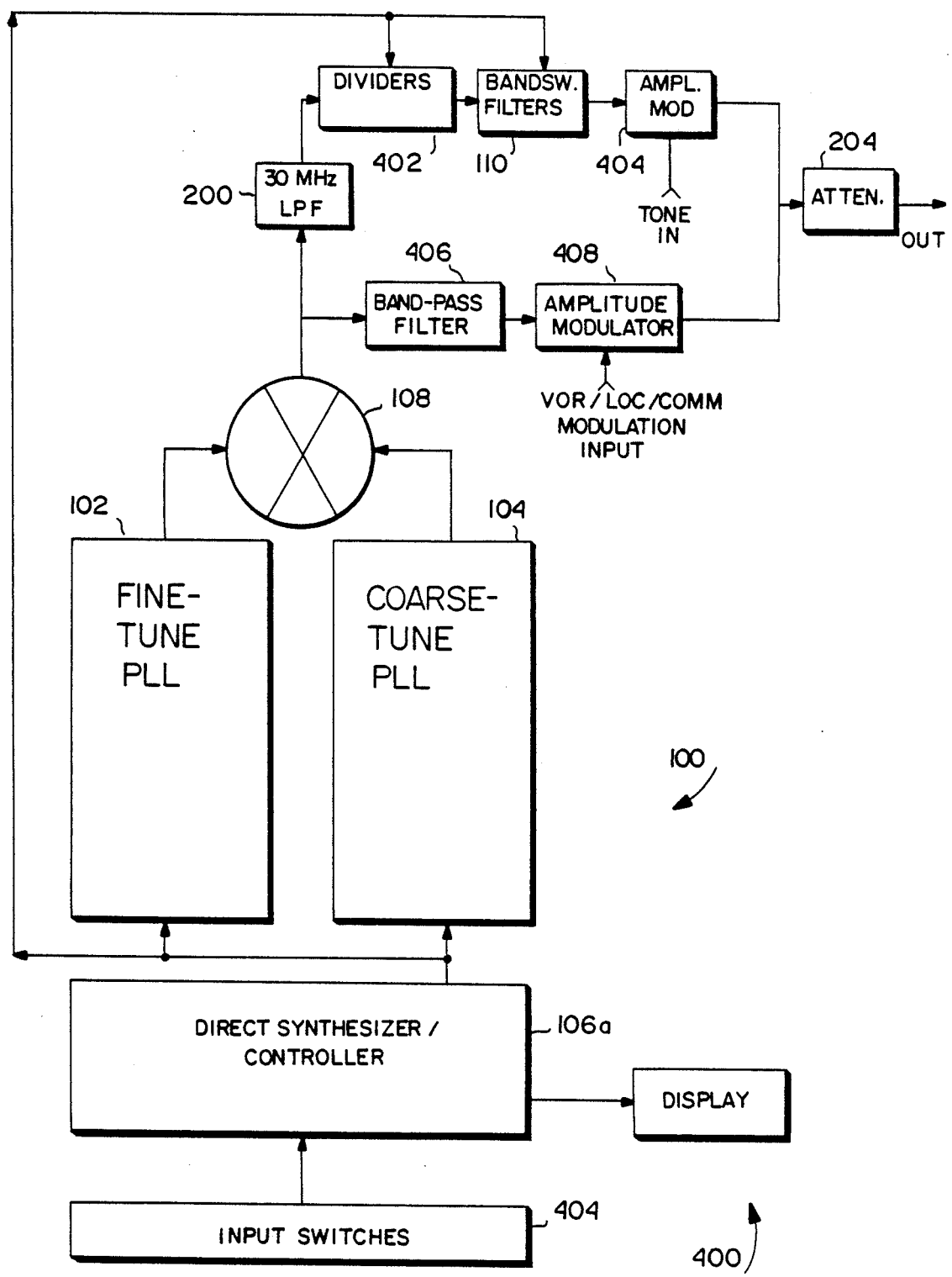
FIG. 22 is a schematic block diagram of an exemplary frequency generator incorporating the frequency synthesizer shown in FIG. 21.

FIG. 22 is a schematic block diagram of a presently preferred signal generator 400 including the frequency synthesizer 100 already described previously. As can be seen, only a few additional components are needed to provide a highly accurate full-function RF signal generator of the type useful for testing radio communications receivers and other equipment—particularly airborne navigation and communication equipment. In the preferred embodiment, the output of mixer 108 passes through 30 MHz lowpass filter and a 108–138 MHz bandpass filter 200 and then is applied to programmable output dividers 402 controlled by direct synthesizer/controller 106a (which may be the microprocessor controlled synthesizer shown in FIG. 20) in response to the settings of input switches 404. Synthesizer/controller 106a also controls the band-switched filter arrangement 110 to select the desired operating band. Output dividers 402 may be used in the manner shown in FIG. 14 to increase the overall frequency range of synthesizer 100 by factors of 10 for example (thus providing a divide-by-100 range of 30.0000 kHz–299.9999 kHz in 0.1 Hz steps; a divide-by-10 range of 300.000 kHz–2.999999 MHz in 1 Hz steps; and a divide-by-1 range of 3.00000 MHz–29.99999 MHz in 10 Hz steps). Bandswitch filters 110 must, of course, be modified to accommodate these additional lower ranges.

The output of bandswitch filter 110 may be tone modulated by modulator 404 before being applied to output attenuator 204. Modulator 404 may be of any desired complexity and type to provide complex modulation waveforms (e.g., voice, single sideband, double sideband or FM)—as is well known to those skilled in the art.

If a higher frequency range is needed, the output of mixer 108 may be applied to the input of a bandpass filter 406 which selects the sum frequency of the mixer 108 output (rather than the difference frequency selected by lowpass filter 200). Bandpass filter 406 may be modulated by a conventional modulator 408 to provide VHF signals in the 108.00000 MHz–139.999999 MHz range with 10 Hz frequency resolution.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

I claim:

1. A programmable frequency synthesizer for producing an output signal at a frequency which closely approximates a desired frequency, said synthesizer including:
   programming means for producing a control signal specifying said desired frequency to within a first frequency spacing;
   phase locked loop means for generating said output signal in response to said control signal and also in response to an input reference signal having a frequency exceeding said first frequency spacing;
   reference oscillator means for producing a first signal; and
   reference frequency altering means operatively coupled to said reference oscillator means and to said programmable means for altering the frequency of said first signal in discrete frequency steps having said first frequency spacing in response to said control signal and for applying said altered first signal to said phase locked loop means as said input reference signal, said first signal frequency alterations introducing errors in the frequency of said output signal,
   wherein said programming means including means for optimizing the output signal frequency errors introduced by said reference frequency altering means to obtain a close approximation of said desired frequency.

2. A frequency synthesizer as in claim 1 wherein said reference frequency altering means includes
   programmable frequency divider means for dividing the frequency of said first signal by a dividing factor responsive to said control signal; and
   means operatively connected to said reference oscillator means for shifting the frequency of said first signal in response to said dividing factor so as to minimize the difference between said desired frequency and said output signal frequency.

3. A frequency synthesizer as in claim 1 wherein said phase locked loop means is incapable of resolving said output signal frequency to within said first frequency spacing.

4. A programmable frequency synthesizer as in claim 1 wherein:
   said reference frequency altering means includes programmable frequency divider means for dividing the frequency of said first signal by a dividing factor having a nominal value; and
   said programming means includes digital signal processing means connected to receive said control signal for optimizing the nominal value of said dividing factor, and dynamically for changing the dividing factor value only a small amount relative to said nominal dividing factor value in response to said control signal so as to minimize the difference between said output signal frequency and said desired frequency.

5. A programmable frequency synthesizer as in claim 4 wherein said digital signal processing means includes means for dynamically calculating said difference in response to said control signal and means for dynamically adjusting said dividing factor to minimize said difference.

6. A frequency synthesizer as in claim 1 wherein:
   the nominal frequency of said phase locked loop means exceeds said desired frequency; and
   said synthesizer further includes mixing means coupled to said loop means for converting the frequency of said loop output signal to said desired frequency.

7. A frequency synthesizer as in claim 1 wherein:
   said reference oscillator means comprises voltage controlled crystal oscillator means including a piezoelectric crystal, said reference oscillator means producing said first signal at a frequency determined by said piezoelectric crystal and also affected by a further control voltage applied thereto; and
   said reference frequency altering means includes means for generating said further control voltage in response to said control signal.

8. A programmable frequency synthesizer for producing an output signal at a frequency which closely approximates a desired frequency, said synthesizer including:
   programming means for specifying said desired frequency to within a first frequency resolution and for producing a control signal responsive to said specified desired frequency;
   first phase locked loop means for generating said output signal in response to said control signal and an input reference signal, said first phase locked loop having a second frequency resolution substantially less than said first resolution; and direct frequency synthesizer means for generating said input reference signal and for changing the frequency of said input reference signal to within said first resolution in response to said control signal, said direct frequency synthesizer means including means connected to receive a standard frequency signal for controllably converting said standard frequency in discrete frequency steps at said first frequency resolution to said input reference signal frequency in response to said control signal while introducing approximation frequency errors in said output signal and for applying the resulting signal to said first phase locked loop means, wherein said programming means further includes means for optimizing said control signal to account at least in part for said approximation frequency errors introduced in said output signal.

9. A frequency synthesizer as in claim 8 wherein:

said first phase locked loop means includes programmable frequency divider means for changing the first phase locked loop means output signal frequency in discrete frequency steps to within said second frequency resolution in response to said control signal; and said programming means includes digital signal processing means for specifying the division factor of said first phase locked loop means programmable frequency divider and the conversion factor of said converting means so as to minimize the difference between said desired frequency and said output signal frequency.

10. A frequency synthesizer as in claim 8 further including:

second phase locked loop means for producing a further output signal and for controlling the frequency of said further output signal in discrete frequency steps at a third frequency resolution less than said second resolution in response to said control signal; and means for combining said first-mentioned and further output signals to provide a carrier signal.

11. A programmable frequency synthesizer for producing an output signal at a frequency which closely approximates a desired frequency, said synthesizer including:

programming means for specifying a desired frequency in coarse, medium and fine resolutions and for producing at least one control signal responsive to said specified desired frequency;

first phase locked loop means for generating a first signal, said first loop means including a first frequency divider means set in response to said coarse specified desired frequency resolution;

second phase locked loop means responsive to a reference signal for generating a second signal, said second loop means including a second frequency divider means set in response to said medium specified desired frequency resolution· direct frequency synthesizer means for generating said reference signal, said direct synthesizer means including means for adjusting the frequency of said reference signal in response to said fine desired frequency resolution indicated by said control signal; and means for combining said first and second signals to produce said output signal.

12. A frequency synthesizer as in claim 11 wherein:

said direct synthesizer means further includes a reference oscillator means for producing a signal at a frequency $F_{ref}$; and said adjusting means includes:

programmable frequency dividing means connected to receive said signal produced by said reference oscillator means for dividing said frequency $F_{ref}$ by a factor determined by said specified desired frequency fine resolution, and error correction means coupled to said reference oscillator means for shifting said frequency $F_{ref}$ in response to said coarse resolution specified frequency so as to reduce expected frequency error in said output frequency, said error connection means shifting said frequency $F_{ref}$ as a function of the absolute frequency of said desired frequency.

13. A frequency synthesizer as in claim 11 wherein said first and second signals each have frequencies which exceed said desired frequency, and said combining means comprises mixing means for heterodyning said first and second signals to provide a difference frequency.

14. A frequency synthesizer as in claim 11 further including:

means for varying the setting of said second frequency dividing means only a small amount relative to the magnitude of said setting in response to said medium specified desired frequency resolution.

15. A frequency synthesizer for producing an output signal at approximately a selected frequency, comprising:

signal controlled oscillator means for producing an output signal at an output frequency in response to a control signal;

programmable divider means connected to receive said oscillator means output signal for dividing said output signal by a preset factor N approximately corresponding to said selected frequency to produce a divided signal at a further frequency;

phase detector means, connected to receive an input signal and said divided signal, for producing said control signal in response to the difference between said input signal frequency and said further frequency;

reference oscillator means for producing a reference signal; and further means connected to receive said reference signal for decreasing but not eliminating the difference between said output frequency and said selected frequency, said further means including means for altering the frequency of said reference signal and for applying said altered reference means as said input signal.

16. A frequency synthesizer as in claim 15 further including means for changing said preset factor N in response to said selected frequency and forr limiting the amount of said change to substantially less than said factor N.

17. A frequency synthesizer as in claim 15 wherein said frequency altering means includes further programmable divider means for dividing the frequency of said reference signal by a further preset factor selected in response to said selected frequency.

18. A frequency synthesizer as in claim 17 wherein said frequency altering means further includes means connected to said reference oscillator means for shifting the reference frequency.

19. A frequency synthesizer as in claim 15 wherein said frequency altering means includes means connected to said reference oscillator means for shifting the reference frequency.

20. A frequency synthesizer as in claim 15 wherein said frequency altering means includes:
   first dividing means connected to receive said reference signal for producing a first intermediate signal at a frequency equal to said reference frequency divided by a factor P;
   second dividing means connected to receive said reference signal for producing a second intermediate signal at a frequency equal to said reference frequency divided by a factor R;
   mixer means for heterodyning said first and second intermediate signals to produce sum and difference components; and
   filter means for selecting one of said sum and difference components, said altered reference frequency being responsive to said selected component.

21. A frequency synthesizer as in claim 20 wherein said frequency altering means further includes third dividing means for dividing said selected component by a factor Q and for applying said divided selected component to said signal controlled oscillator as said altered reference frequency.

22. A frequency synthesizer as in claim 21 wherein said factor changing means comprises microprocessor means, connected to said first dividing means and also connected to receive an indication of said selected frequency, for calculating said P factor to minimize the error between said output frequency and said selected frequency and for programming said first dividing means with said calculated P factor.

23. A frequency synthesizer as in claim 22 wherein said microprocessor means includes calculating means for calculating said error, said P factor and said N factor in response to the term $$\frac{N}{Q}\left(\frac{1}{R} + \frac{1}{P}\right)$$

so as to minimize said error.

24. A frequency synthesizer as in claim 22 wherein:
   one of said factors P and R is fixed; and
   said synthesizer further includes means for programming the other of said factors and programming said preset factor N in response to said selected frequency so as to minimize the difference between said output frequency and said selected frequency.

25. A frequency synthesizer as in claim 15 wherein said adjusting means includes microprocessor means, connected to said programmable divider means and also connected to receive an indication of said selected frequency, for calculating a factor which minimizes the error between said output frequency and said selected frequency and for programming said programmable divider means with said calculated factor.

26. A programmable frequency synthesizer for producing an output signal at a frequency which closely approximates a desired frequency, said synthesizer including:
   programming means for specifying a desired frequency in coarse, medium and fine resolutions and for producing at least one control signal responsive to said specified desired frequency;
   first phase locked loop means for generating a first signal, said first loop means including a first frequency divider means for dividing by a factor X responsive to said coarse specified desired frequency resolution;
   second phase locked loop means responsive to a reference signal for generating a second signal, said second loop means including a second frequency divider means for dividing by a factor N responsive to said medium specified desired frequency resolution;
   direct frequency synthesizer means for generating said reference signal, said direct synthesizer means including means for adjusting the frequency of said reference signal by a factor P responsive to said fine desired frequency resolution indicated by said control signal; and
   means for combining said first and second signals to produce said output signal,
   wherein said programming means includes means for optimizing nominal values of N and P to reduce the error between said output signal frequency and said desired frequency, means for adjusting said N value only a small amount relative to the nominal value of N in response to said desired frequency medium resolution, means for adjusting said X value in response to said desired frequency coarse resolution, and means for adjusting said P value only a small amount relative to said nominal P value in response to said desired frequency fine resolution and in response to said adjusted X value so as to reduce said error.

27. A method for synthesizing an output signal at a frequency which closely approximates a desired frequency comprising the steps of:
   (a) specifying a desired frequency in coarse, medium and fine resolutions;
   (b) indirectly generating a first signal, including dividing said generated signal by a factor X responsive to said coarse specified desired frequency resolution;
   (c) indirectly generating a second signal, including dividing said second signal by a factor N responsive to said medium specified desired frequency resolution;
   (d) directly generating a reference signal, including adjusting the frequency of said reference signal by a factor P responsive to said fine desired frequency resolution indicated by said control signal;
   (e) combining said first and second signals to produce said output signal;
   (f) optimizing nominal values of N and P to reduce the error between said output signal frequency and said desired frequency;
   (g) adjusting said N value only a small amount relative to the nominal value of N in response to said desired frequency medium resolution;
   (h) adjusting said X value in response to said desired frequency coarse resolution; and
   (i) adjusting said P value only a small amount relative to said nominal P value in response to said desired frequency fine resolution and in response to said adjusted X value so as to reduce said error.

* * * * *